US008298749B2

(12) United States Patent
Iihara et al.

(10) Patent No.: US 8,298,749 B2

(45) Date of Patent: Oct. 30, 2012

(54) DIRECTLY IMAGEABLE WATERLESS PLANOGRAPHIC PRINTING PLATE PRECURSOR AND METHOD FOR PRODUCING SAME

(75) Inventors: Akihiro Iihara, Otsu (JP); Yuta Shuto, Otsu (JP); Yutaka Ishida, Okazaki (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 13/202,417

(22) PCT Filed: Mar. 31, 2010

(86) PCT No.: PCT/JP2010/055786

§ 371 (c)(1),
(2), (4) Date: Aug. 19, 2011

(87) PCT Pub. No.: WO2010/113989

PCT Pub. Date: Oct. 7, 2010

(65) Prior Publication Data

US 2011/0300486 A1 Dec. 8, 2011

(30) Foreign Application Priority Data

Mar. 31, 2009 (JP) ................................ 2009-085405

(51) Int. Cl.
*G03F 7/09* (2006.01)
*G03F 7/11* (2006.01)
*G03F 7/26* (2006.01)
*G03F 7/34* (2006.01)
*B41N 1/06* (2006.01)

(52) U.S. Cl. .................... 430/272.1; 430/300; 430/302; 430/306; 430/309; 101/453; 101/463.1

(58) Field of Classification Search ............... 430/270.1, 430/271.1, 272.1, 300, 302, 306, 309; 101/453, 101/463.1

See application file for complete search history.

(56) References Cited

U.S. PATENT DOCUMENTS 4,853,313 A 8/1989 Mori et al.

FOREIGN PATENT DOCUMENTS

| | | | |
|---|---|---|---|
| JP | 63-46465 | A | 2/1988 |
| JP | 63-179361 | | 7/1988 |
| JP | 02-063050 | | 3/1990 |
| JP | 04-002265 | | 1/1992 |
| JP | 04-163557 | | 6/1992 |
| JP | 04-343360 | | 11/1992 |
| JP | 05-002272 | | 1/1993 |
| JP | 05-006000 | | 1/1993 |
| JP | 09-034132 | | 2/1997 |
| JP | 2004-799016 | | 7/2004 |
| JP | 2004-334025 | | 11/2004 |
| JP | 2005-300586 | A | 10/2005 |
| JP | 3716429 | | 11/2005 |
| JP | 2005-331924 | | 12/2005 |
| JP | 2005-331924 | A | 12/2005 |
| JP | 2006-276385 | | 10/2006 |

OTHER PUBLICATIONS

Machine translation of JP 2005-331924 published on Dec. 2, 2005.*
"Isopar M" Isoparaffin Fluid—Exxon Mobil 2012.*

* cited by examiner

*Primary Examiner* — Anca Eoff
(74) *Attorney, Agent, or Firm* — DLA Piper LLP (US)

(57) ABSTRACT

Provided is a directly imageable waterless planographic printing plate precursor that comprises at least a heat sensitive layer and a silicone rubber layer formed on a substrate in this order and has a high sensitivity not only immediately after the precursor production but also after the passage of time. In the directly imageable waterless planographic printing plate precursor, the heat sensitive layer contains liquid bubbles filled with a liquid with a boiling point in the range of 210 to 270° C. Also provided is a production method for making a directly imageable waterless planographic printing plate precursor.

11 Claims, No Drawings

DIRECTLY IMAGEABLE WATERLESS PLANOGRAPHIC PRINTING PLATE PRECURSOR AND METHOD FOR PRODUCING SAME

RELATED APPLICATIONS

This is a §371 of International Application No. PCT/JP2010/055786, with an international filing date of Mar. 31, 2010 (WO 2010/113989 A1, published Oct. 7, 2010), which is based on Japanese Patent Application No. 2009-85405, filed Mar. 31, 2009, the subject matter of which is incorporated by reference.

TECHNICAL FIELD

This disclosure relates to a directly imageable waterless planographic printing plate precursor and a production method thereof.

BACKGROUND

Various printing plates that use silicone rubber or fluorine resin as ink repellent layer and that are designed for conducting planographic printing without using a dampening solution (hereinafter called waterless planographic printing) have been proposed. Waterless planographic printing is a planographic printing method in which the image areas and the non-image areas exist on almost the same plane, and the image areas and the non-image areas act as in acceptable layer and ink repellent layer, respectively. The ink adheres only to the image areas because of the difference in the adhesive properties, and the ink adhered to the image area is transferred to printing material such as paper. The feature of this method is to be able to perform printing without using a dampening solution.

There are various exposure methods proposed for waterless planographic printing plate precursors. They are broadly divided into two types: methods that use ultraviolet rays for irradiation through a plate making film, and computer-to-plate (hereinafter called "CTP") methods in which the original pattern is directly incised without using a plate making film. The CTP methods are further divided into some types such as methods that use laser for irradiation, those using a thermal head for image transfer, those using a pin electrode to apply voltage to specific parts, and those using an ink-jet apparatus to form an ink acceptable layer or an ink repellent layer. Of these, methods that use laser irradiation are superior to the other methods in terms of resolution and plate processing speed.

There are two types of methods that use laser irradiation: the photon mode that uses photoreaction and the heat mode that uses photothermal conversion to cause thermal reaction. The utility of the heat mode is increasing because of its advantage for use in a bright room and the rapid progress of the semiconductor laser to be used as light source.

Various proposals have been made relating to directly imageable waterless planographic printing plate precursors that is designed for the heat mode described above. In particular, directly imageable waterless planographic printing plate precursors that contain bubbles in their heat sensitive layers have been proposed as a type of directly imageable waterless planographic printing plate precursors that can perform plate processing with less laser radiation energy and achieve a high image reproducibility (see Japanese Unexamined Patent Publication (Kokai) No. 2005-300586 (Claims), for example). To produce a directly imageable waterless planographic printing plate precursor that can perform plate processing with less laser irradiation energy and achieve a high image reproducibility, proposals have been made for directly imageable waterless planographic printing plate precursor production methods that comprise a step of applying a solution of a heat sensitive layer composition containing an organic solvent with a solubility parameter of 17.0 $(MPa)^{1/2}$ or less and a step of drying the heat sensitive layer composition (see Japanese Unexamined Patent Publication (Kokai) No. 2005-33192 (Claims), for example).

The directly imageable waterless planographic printing plate precursors produced by the technology described in Japanese Unexamined Patent Publication (Kokai) No. 2005-300586 (Claims) and Japanese Unexamined Patent Publication (Kokai) No. 2005-331924 (Claims) are highly sensitive immediately after the precursor making process, but there has been the problem of sensitivity degradation over time. Thus, it could be helpful to provide directly imageable waterless planographic printing plate precursors that are highly sensitive not only immediately after the precursor making process but also after the passage of time.

SUMMARY

We provide a directly imageable waterless planographic printing plate precursor comprising at least a heat sensitive layer and a silicone rubber layer formed on a substrate in this order, wherein said heat sensitive layer contains liquid bubbles incorporating a liquid with a boiling point in the range of 210 to 270° C.

We also provide a method for producing directly imageable waterless planographic printing plate precursors comprising at least the following steps: a step of applying a solution of a heat sensitive layer composition that contains a solvent with a solubility parameter of 17.0 $(MPa)^{1/2}$ or less and a boiling point in the range of 210 to 270° C. and a solvent with a solubility parameter of more than 17.0 $(MPa)^{1/2}$ over a substrate or a substrate coated with a resin layer; a step of drying said solution of a heat sensitive layer composition to form a heat sensitive layer; and a step of applying a silicone rubber layer composition over said heat sensitive layer to form a silicone rubber layer.

We produce directly imageable waterless planographic printing plate precursors that are highly sensitive not only immediately after the precursor making process, but also after the passage of time.

DETAILED DESCRIPTION

The directly imageable waterless planographic printing plate precursor comprises at least a heat sensitive layer and a silicone rubber layer formed on a substrate in this order, wherein said heat sensitive layer contains liquid bubbles. The waterless planographic printing plate precursor as referred to herein is a precursor that serves to produce a planographic printing plate that does not require a dampening solution for printing, and the directly imageable waterless planographic printing plate precursor is a waterless planographic priming plate precursor in which an original pattern is directly incised using laser beam. The liquid bubbles according to this invention are bubbles that are filled with a liquid, and they are clearly different from the air bubbles described in Japanese Unexamined Patent Publication (Kokai) No. 2005-300586. The existence of bubbles can be detected morphologically by observing a cross section of the heat sensitive layer using an analysis instrument such as transmission electron microscope. The fact that the bubbles in the heat sensitive layer are liquid bubbles filled with a liquid has been confirmed based on the following: (1) the volume of the bubbles estimated from morphological observation of their shape is nearly equivalent to the amount of the solvent with a solubility parameter of 17.0 $(MPa)^{1/2}$ or less and a boiling point in the range of 210 to 270° C. that is contained in the solution of a heat sensitive layer composition, liquid with a solubility parameter of 17.0 $(MPa)^{1/2}$ or less and a boiling point in the range of 210 to 270° C. is detected by temperature programmed desorption mass spectrometry of the heat sensitive layer, and its detected amount is nearly equivalent to the amount of the solvent contained in the solution of a heat sensitive layer composition, (3) the volume of the bubbles estimated from morphological observation of their shape is nearly equivalent to the amount of the liquid with a solubility parameter is 17.0 $(MPa)^{1/2}$ or less and a boiling point in the range of 210 to 270° C. detected in the temperature programmed desorption mass spectrometry of the heat sensitive layer, and (4) the solvent with a solubility parameter of 17.0 $(MPa)^{1/2}$ or less and a boiling point in the range of 210 to 270° C. contained in the solution of a heat sensitive layer composition is extremely low in the solubility in the other components of the heat sensitive layer and is unlikely to exist in the other portions than the liquid bubbles in the heat sensitive layer.

Directly imageable waterless planographic printing plate precursors that contain air bubbles in the heat sensitive layer have high sensitivity immediately after the precursor making process (initial sensitivity), but can suffer deterioration in sensitivity over time. On the other hand, the directly imageable waterless planographic printing plate precursor of this invention maintains a high sensitivity not only immediately after the precursor making process but also after the passage of time. Cross sections of the heat sensitive layers of said directly imageable, waterless planographic printing plate precursor were observed with an electron microscope. In the case of directly imageable waterless planographic printing plate precursors that contain air bubbles in their heat sensitive layers, bubbles were detected in their heat sensitive layers immediately after the precursor making process, but they disappeared after the passage of time. On the other hand, in the case of the directly imageable waterless planographic, printing plate precursor of this invention, liquid bubbles were seen not only immediately after the precursor making process, but also after the passage of time.

The directly imageable waterless planographic printing plate precursor is explained below. The directly imageable waterless planographic printing plate precursor comprises at least a heat sensitive layer and a silicone rubber layer formed on a substrate in this order.

For substrates, dimensionally stable, publicly known materials such as paper, metal, and film which have been conventionally used as substrate material of printing plates can be used. Specific examples include paper; paper laminated with plastic material (polyethylene, polypropylene, polystyrene, etc.); metal plates such as aluminum (including aluminum alloys), zinc, and copper; films of plastics such as cellulose acetate, polyethylene terephthalate, polyethylene, polyester, polyamide, polyimide, polystyrene, polypropylene, polycarbonate, and polyvinyl acetal; and paper or plastic film laminated or deposited with said metals. The plastic films may be transparent or opaque. From the viewpoint of proofing, opaque film is preferable.

Of these substrates, an aluminum plate is preferable because it is extremely stable dimensionally and low in price. As a flexible substrate for quick printing, polyethylene terephthalate film is particularly preferable.

The thickness of the substrate is not limited. An appropriate thickness suitable for the printer to be used for planographic priming may be selected.

For the heat sensitive layer, a layer whose physical properties can be changed by laser irradiation and/or a layer whose adhesiveness to the silicone layer can be decreased by laser irradiation is preferable. Examples include a layer that is produced by applying a composition consisting of a polymer with active hydrogen, a crosslinking agent and a light-to-heat conversion material, or a composition consisting of a polymer with active hydrogen, an organic complex and a light-to-heat conversion material, followed by drying (by heating).

The heat sensitive layer contains liquid bubbles incorporating a liquid with a boiling point in the range of 210 to 270° C. The heat sensitive layer that contains liquid bubbles incorporating a liquid with a boiling point in a specific range serves to produce a directly imageable waterless planographic printing plate precursor that can maintain a high sensitivity for a long period. If all liquid components contained in the liquid bubbles have to boiling point below 210° C., it will be difficult to maintain the morphology of the liquid bubbles in the heat sensitive layer for a long period of time. Consequently, though the sensitivity is initially high, it decreases with time. On the other hand, if all liquid components have a boiling point above 270° C., the improvement in initial sensitivity will be small. In addition, the liquid may bleed out to the surface of the heat sensitive layer, or peeling of the silicone layer may take place during development. The boiling point of a liquid refers to its boiling point under atmospheric pressure. If there are multiple boiling points such as in the ease where two or more liquid components are contained in the liquid bubbles, it is preferable that the weight percent of the liquid components with a boiling point in the range of 210 to 270° C. is 60% or more, more preferably 80% or more, still more preferably 90% or more, and still more preferably 100%.

The liquid components contained in the liquid bubbles can be identified by collecting gas obtained from temperature programmed desorption mass spectrometry and analyzing the composition of the gas.

It is preferable that the solubility parameter of the liquid contained in the liquid bubbles is 17.0 $(MPa)^{1/2}$ or less, more preferably 16.5 $(MPa)^{1/2}$ or less. Since a liquid with a solubility parameter of 17.0 $(MPa)^{1/2}$ or less is low in compatibility with the polymers mentioned below, the solubility of the polymers in such a liquid and/or the solubility of the liquid in the polymers will be low, allowing bubbles of the liquid to persist easily in the heat sensitive layer (in a polymer with film forming property).

The solubility parameter refers to the Hildebrand solubility parameter, which is the quantity δ defined as $\delta=(\Delta H/V)^{1/2}$ where ΔH denotes the molar enthalpy of vaporization of the liquid, and V denotes its molar volume. The unit $(MPa)^{1/2}$ is used to represent the solubility parameter. The unit $(cal\cdot cm^{-3})^{1/2}$ is also used often to represent the solubility parameter, and they have the relationship $\delta(MPa)^{1/2}=2.0455\times\delta(cal\cdot cm^{-3})^{1/2}$. More specifically, the solubility parameter of 17.0 $(MPa)^{1/2}$ is equal to 8.3 $(cal\cdot cm^{-3})^{1/2}$. Liquids with a solubility parameter of 17.0 $(MPa)^{1/2}$ or less include, but not limited to, aliphatic hydrocarbon, alicyclic hydrocarbon, and alkylene oxide dialkyl ether. Aliphatic saturated hydrocarbons are preferable from the viewpoint of cost effectiveness and safety.

The solubility parameter of a liquid contained in liquid bubbles can also be obtained from literature based on their structure identified from the composition of gas obtained in temperature programmed desorption mass spectrometry.

Examples of the liquid with a boiling point in the range of 210 to 270° C. and a solubility parameter of 17.0 $(MPa)^{1/2}$ or less include linear, branched, or cyclic hydrocarbon with a carbon number of 12 to 18, and alkylene glycol dialkyl ethers such as diethylene glycol butyl methyl ether (boiling point 212° C., solubility parameter 16.0 $(MPa)^{1/2}$), diethylene glycol dibutyl ether (boiling point 256° C., solubility parameter 15.8 $(MPa)^{1/2}$), triethylene glycol dimethyl ether (boiling point 216° C., solubility parameter 1.6.2 $(MPa)^{1/2}$), triethylene glycol butyl methyl ether (boiling, point 261° C., solubility, parameter 16.2 $(MPa)^{1/2}$), and tripropylene glycol dimethyl ether (boiling point 215° C., solubility parameter 15.1 $(MPa)^{1/2}$). Two or more thereof may be used in combination.

To improve the initial sensitivity and the sensitivity after the passage of time, it is preferable that at least one liquid bubble exists in the irradiation area of the laser beam applied during the exposure process for the production of a waterless planographic printing plate. The irradiation area of the laser beam used in typical plate processing machines is about 100 $\mu m^2$ (a square about 10 μm on a side).

The number density of liquid bubbles in the heat sensitive layer can be determined by observing the cross section of the heat sensitive layer using an analytical instrument such as transmission electron microscope. It is preferable that the number of liquid bubbles with a diameter of 0.01 μm or more as described later is 20 or more, more preferably 200 or more, per observation width of 10 μm in the cross section of the heat sensitive layer. If the number of liquid bubbles with a diameter of 0.01 μm or more is 20 or more per observation width of 10 μm, the initial sensitivity and the sensitivity after the passage of time are improved.

The spatial distribution of liquid bubbles in the heat sensitive layer may be uniform or may vary through the thickness. To improve the initial sensitivity and the sensitivity after the passage of time, it is preferable that 10 or more, more preferably 100 or more, liquid bubbles with a diameter of 0.01 μm exist within a 0.5 μm depth into the cross section of the heat sensitive layer from its interface with the silicone rubber layer (5 $\mu m^2$ area i.e., 0.5 μm depth from the interface with the silicone rubber layer×observation width 10 μm).

The diameter of said liquid bubbles is preferably 0.01 μm or more, more preferably 0.05 μm or more, and still more preferably 0.10 μm or more. On the other hand, it is preferably 1.00 μm or less, more preferably 0.50 μm or less, and still more preferably 0.30 μm or less. The volume of liquid bubbles in said diameter range preferably accounts for 50% or more, more preferably 80% or more, and still more preferably 90% or more, of the total volume of liquid bubbles. The average diameter of the liquid bubbles is preferably 0.10 to 1 μm, more preferably 0.10 to 0.30 μm, and still more preferably 0.25 μm or less. If the sizes of the liquid bubbles are within the above range, the initial sensitivity and the sensitivity after the passage of time will further improve.

The content of the liquid bubbles in the heat sensitive layer is preferably 0.1 volume percent or more, preferably 1 volume percent or more, and still more preferably 5 volume percent or more. However, from the viewpoint of solvent resistance and printing durability, it is preferable that the content of the liquid bubbles is 50 volume percent or less, more preferably 40 volume percent or less, and still more preferably 20 volume percent or less.

The size of a liquid bubble can be determined by observing a cross section of the heat sensitive layer using a transmission electron microscope with an acceleration voltage of 100 kV and a magnification of 2,000 times. In a gray-scale TEM picture, a white circular region observed in a gray background of the heat sensitive layer represents the cross section of a liquid bubble. Of the white circular regions, 30 circular regions with high whiteness and a clear contour (cross sections virtually passing through the center of liquid bubbles) are randomly selected, and their diameters are measured, followed by calculating the number average of them, which is taken as their average diameter. In addition, the area percentage of the circular regions was determined based on the ratio between the area of the heat sensitive layer and the area of the circular regions, followed by calculating the volume percentage by converting the circular regions into spheres.

In the directly imageable waterless planographic printing plate precursor, the thickness of the heat sensitive layer is preferably 0.1 to 10 $g/m^2$, more preferably 0.5 to 7 $g/m^2$.

Polymers containing active hydrogen that are suitable as material of the heat sensitive layer include polymers comprising a structural unit with active hydrogen such as —OH, —SH, $—NH_2$, —NH—, $—CO—NH_2$, —CO—NH—, —OCO—NH—, —NH—CO—NH—, —CO—OH, —CS—OH, —CO—SH, —CS—SH, $—SO_3H$, $—PO_3H_2$, $—SO_2—NH_2$, —SO—NH—, and $—CO—CH_2—CO—$. Polymers comprising such structural units include homopolymers or copolymers of unsaturated ethylene-based monomers with active hydrogen (the monomer components in the copolymers may be other unsaturated ethylene-based monomers with active hydrogen or unsaturated ethylene-based monomers without active hydrogen) including homopolymers or copolymers of carboxyl-containing monomers such as acrylic acid and methacrylic acid, homopolymers or copolymers of hydroxy-containing acrylic ester or methacrylic acid ester such as hydroxyethyl methacrylate and 2-hydroxypropyl acrylate, homopolymers or copolymers of N-alkyl acrylamide or acrylamide, homopolymers or copolymers of reactants of an amine with glycidyl acrylate, glycidyl methacrylate or allyl glycidyl, and homopolymers or copolymers of p-hydroxystyrene or vinyl alcohol; and condensates comprising a structural unit that contains active hydrogen in the backbone chain such as polyurethane resins, polyurea resins, polyamide resins (nylon resins), epoxy resins, polyalkylene imines, novolac resins, resol resins, and cellulose derivatives. Two or more of them may be contained.

In particular, polymers containing an alcoholic hydroxyl group, phenolic hydroxyl group, or carboxyl group are preferable, and polymers containing a phenolic hydroxyl group (e.g., a homopolymer or copolymer of p-hydroxystyrene; novolac resin, resole resin, etc.) are more preferable.

The weight percent of the polymers with active hydrogen in the total solid content in the heat sensitive layer is preferably 20% to 95%, more preferably 50% to 90%.

It is also preferable to use a film-forming polymer without active hydrogen thereinafter called "other polymers") in combination with a polymer with active hydrogen. Examples of the other polymers include homopolymers or copolymers of a (meth)acrylate such as polymethyl (meth)acrylate and polybutyl (meth)acrylate, homopolymers or copolymers of a styrene-based monomer such as polystyrene and α-methylstyrene, various synthetic rubbers such as isoprene and styrene-butadiene, homopolymers of a vinylester etc. such as polyvinyl acetate, copolymers such as vinyl acetate-vinyl chloride, various condensation polymers such as polyester and polycarbonate.

The weight percent of the other polymers described above in the total solid content in the heat sensitive layer is preferably 50% or less, more preferably 30% or less, and still more preferably 10% or less.

The crosslinking agent may be a known crosslinkable polyfunctional compound. Examples include polyfunctional isocyanate, polyfunctional blocked isocyanate, polyfunctional epoxide, polyfunctional acrylate compound, polyfunctional aldehyde, polyfunctional mercapto compound, polyfunctional alkoxy silyl compound, polyfunctional amine compound, polyfunctional carboxylic acid, polyfunctional vinyl compound, polyfunctional diazonium salts, polyfunctional azide compound, and hydrazine.

The organic complex compound is composed of a metal and an organic compound, and functions as a crosslinking agent for polymers with active hydrogen and/or as a catalyst for thermosetting reactions. Even when the organic complex compound functions as a crosslinking agent, said crosslinking agents may be additionally contained in the heat sensitive layer.

Examples of the organic complex compound include organic complex salts consisting of an organic ligand coordinated with metal, organic-inorganic complex salts consisting of an organic ligand and an inorganic ligand coordinated with metal, and metal alkoxides consisting of a metal and organic molecules covalently bonded via oxygen. Of them, metal chelate compounds with a ligand containing two or more donor atoms to form a ring containing metallic atoms are preferred in respect of stability of the material itself and the stability of the solution of the heat sensitive layer composition.

Major preferable metals that form an organic complex compound include Al(III), Ti(IV), Fe(II), Fe(iii), Co(II), Ni(II), Ni(IV), Cu(I), Cu(II), Zn(II), Ge, In, Sn(II), Sn(IV), Zr(IV), and Hf(IV). AMID is particularly preferable because it can improve the sensitivity effectively, and Ti(IV) is particularly preferable because it serves effectively to develop resistance to printing inks and ink-washing solvents.

The ligand may be a compound having a coordinating group containing oxygen, nitrogen, sulfur, etc. as donor atom. Specific examples of said coordinating group include those with oxygen as donor atom such as —OH (alcohol, enol, and phenol), —COOH (carboxylic acid), >C═O (aldehyde, ketone, quinone), —O— (ether), —COOR (ester with R denoting aliphatic or aromatic hydrocarbon), —N═O (nitroso compound), $—NO_2$ (nitro compound), >N—O (N-oxide), $—SO_3H$ (sulfonic acid), and $—PO_3H_2$ (phosphorous acid); those with nitrogen as donor atom such as $—NH_2$ (primary amine, amide, hydrazine), >NH (secondary amine, hydrazine), >N— (tertiary amine), —N═N— (azo compound, heterocyclic compound), ═N—OH (oxime), $—NO_2$ (nitro compound), —N═O (nitroso compound), >C═N— (Schiff base, heterocyclic compound), >C═NH (aldehyde, ketone imine, enamines), and —NCS (isothiocyanato); and those with sulfur as donor atom such as —SH (thiol), —S— (thioether), >C═S (thioketone, thioamide), ═S— (heterocyclic compound), —C(═O)—SH, —C(═S)—OH, (thiocarboxylic acid), and —SCN (thiocyanate).

Of these organic complex compounds consisting of a metal and a ligand, preferred compounds include complex compounds of a metal such as Al(III), Ti(IV), Fe(II), Fe(III), Mn(III), Co(II), Co(III), Ni(II), Ni(IV), Cu(I), Ge, In, Sn(II), Sn(IV), Zr(IV), and Hf(IV) with a β-diketone, amine, alcohol, or carboxylic acid, and furthermore, particularly preferable complex compounds include acetylacetone complex and acetoacetic acid ester complex of Al(III), Fe(II), Fe(III), Ti(IV), or Zr(IV).

Specific examples of such compounds are for instance as follows. Thus, they include aluminum tris-(acetylacetonate), aluminum tris-(ethyl acetoacetate), aluminum tris-(propyl acetoacetate), aluminum tris-(butyl acetoacetate), aluminum tris-(hexyl acetoacetate), aluminum tris-(nonyl acetoacetate), aluminum tris-(hexafluoropentadionate), aluminum tris-(2,2,6,6-tetramethyl-3,5-heptanedionate), aluminum bis(ethyl acetoacetate) mono(acetylacetonate), aluminum bis(acetylacetonate) mono(ethyl acetoacetate), aluminum bis(propyl acetoacetate) mono(acetylacetonate), aluminum bis(butyl acetoacetate) mono(acetylacetonate), aluminum bis(hexyl acetoacetate) mono(acetylacetonate), aluminum bis(propyl acetoacetate) mono(ethyl acetoacetate), aluminum bis(butyl acetoacetate) mono(ethyl acetoacetate), aluminum bis(hexyl acetoacetate) mono(ethyl acetoacetate), aluminum bis(nonyl acetoacetate) mono(ethyl acetoacetate), aluminum dibutoxide mono(acetylacetonate), aluminum diisopropoxide mono (acetylacetonate), aluminum diisopropoxide, mono(ethyl acetoacetate), aluminum-s-butoxide bis(ethyl acetoacetate), aluminum di-s-butoxide mono(ethyl acetoacetate), and aluminum mono(−9-octadecenyl acetoacetate) diisopropoxide. Also included are titanium mono(allyl acetoacetate) tri-isopropoxide, titanium bis(tri ethanol amine) di-isopropoxide, titanium bis(triethanol nine) di-n-butoxide, titanium diisopropoxide bis(acetylacetonate), titanium di-n-butoxide bis (acetylacetonate), titanium diisopropoxide bis(2,2,6,6-tetramethyl-3,5-heptanedionate), titanium diisopropoxide bis (ethyl acetoacetate), titanium di-n-butoxide bis(ethyl acetoacetate), titanium mono(ethyl acetoacetate) tri-n-butoxide, titanium mono(methacryloxy ethyl acetoacetate) tri isopropoxide, titanium oxide bis(acetylacetonate) titanium tetra (2-ethyl-3-hydroxyhexyl oxide), titanium dihydroxy bis (lactate), and titanium (ethyleneglycolate) bis(dioctyl phosphate). Also included are zirconium di-n-butoxide bis (acetylacetonate), zirconium tetrakis (hexafluoropentane dionate), zirconium tetrakis (trifluoropentane dionate), zirconium methacryloxy ethyl acetoacetate tri-n-propoxide, zirconium tetrakis (acetylacetonate), zirconium tetrakis (2,2,6,6-tetramethyl-3,5-heptanedionate), triglycolate zircon acid, and trilactate zircon acid. Also included are iron(III) acetylacetonate, dibenzoyl methane iron(II), tropolone iron, tristropolone iron(III), hinokitiol iron, tris-hinokitiol iron(III), acetoacetate, iron(III) benzoyl acetonate, iron(III) diphenyl propanedionate, iron(III) tetramethyl heptanedionate, and iron(III) trifluoro pentanedionate. Two or more of these may be contained.

The weight percent of these organic complexes in the total solid content in the heat sensitive layer is preferably 0.5% to 50%, more preferably 3 to 30%. If the weight percent of the organic complexes is 0.5% or more, the effect mentioned above will further improve. On the other hand, a high priming durability is maintained in the printing plate when the weight percent is 50% or less.

There are no specific limitations on the light-to-heat conversion material as long as it absorbs laser beam, but pigments or dyes that absorb infrared radiation or near infrared radiation are preferable. Examples include black pigments such as carbon black, carbon graphite, aniline black, and cyanine black; phthalocyanine- or naphthalocyanine-based green pigments; inorganic compounds containing water of crystallization; metal powder such as iron, copper, chromium, bismuth, magnesium, aluminum, titanium, zirconium, cobalt, vanadium, manganese, and tungsten; and oxide, sulfide, hydroxide, silicate, sulfate, phosphate, complex of a diamine compound, complex of a dithiol compound, complex of a phenolthiol compound, and complex of a mercaptophenol compound that contain any of the former metals.

Preferred examples of the dye that absorbs infrared radiation or near infrared radiation include dyes for electronic devices or recorders with a maximum absorption wavelength in the range from 700 nm to 1,100 nm, preferably 700 nm to 900 nm, such as cyanine dyes, azulenium dyes, squarylium dyes, croconium dyes, azo disperse dyes, bisazostilbene dyes, naphtoquinone dyes, anthraquinone dyes, perylene dyes, phthalocyanine dyes, naphthalocyanine metal complex dyes, polymethine dyes, dithiol nickel complex dyes, indoaniline metal complex dyes, intermolecular type CT dyes, spirobenzothiopyran, and nigrosin dyes.

Of these dyes, those with a large molar absorption coefficient ϵ are preferred. More specifically, c is preferably $1\times10^4$ or more, more preferably $1\times10^5$ or more. When ϵ is $1\times10^4$ or more, the initial sensitivity improves.

Two or ore of these light-to-heat conversion materials may be contained. Containing 2 or more light-to-heat conversion materials with different absorption wavelengths makes it possible to support 2 or more lasers with different transmission wavelengths.

Of those mentioned above, preferable dyes include carbon black and dyes that absorb infrared radiation or near infrared radiation from the viewpoint of the light-to-heat conversion ratio, cost effectiveness, and handleability.

The weight percentage of these light-to-heat conversion materials in the total solid content in the heat sensitive layer is preferably 0.1 to 70%, more preferably 0.5 to 40%. When the weight percent of the light-to-heat conversion materials is 0.1% or more, the sensitivity to laser light improves. On the other hand, high printing durability is maintained in the printing plate when it is 70% or less.

The heat sensitive layer of the directly imageable waterless planographic printing plate precursor may contain various additives as necessary. For example, it may contain silicone surface-active agents, fluorine surface-active agents, etc., to improve the coatability. It may also contain silane coupling agents or titanium coupling agents to improve the adhesiveness to the silicone rubber layer. The required content of the above additives varies according to the purpose, but in general, their weight percentage is 0.1 to 30% in the total solid content.

The thermal softening point of the heat sensitive layer is preferably 50° C. or more, more preferably 60° C. or more. When the thermal softening point is 50° C. or more, the fluidity of the heat sensitive layer at room temperature is reduced, and the sensitivity after the passage of time is enhanced. The thermal softening point of the heat sensitive layer depends largely on the thermal softening point of the polymer containing active hydrogen, which is the main component of the heat sensitive layer. Therefore, it is preferred that a polymer with a thermal softening point of 50° C. or more is used as said polymer containing active hydrogen. In particular, polymers with a thermal softening point of 50° C. or MOM that has an alcoholic hydroxyl group, phenolic hydroxyl group, or carboxyl group are more preferable, and polymers with a thermal softening point of 50° C. or more that has a phenolic hydroxyl group (homopolymer or copolymer of p-hydroxystyrene or novolac resin, resole resin, etc.) are still more preferable.

The silicone rubber layer of the waterless planographic printing plate precursor may be produced by applying an addition reaction type silicone rubber layer composition or a condensation reaction type silicone rubber layer composition, or may be produced by applying and (heat-)drying a solution of said composition.

The addition reaction type silicone rubber layer composition preferably comprises at least organo-polysiloxane containing a vinyl group, a compound containing a SiH group (addition reaction type crosslinking agent), and a curing catalyst. It may additionally contain a reaction inhibitor.

The organo-polysiloxane containing a vinyl group has the structure expressed by the following formula (I), and has a vinyl group at the end of the backbone chain or in the backbone chain. In particular, those having a vinyl group at the end of the backbone chain are preferable. Two or more of these may be contained.

$$-(SiR^1R^2-O-)_n- \quad (I)$$

In the formula, n expresses an integer of 2 or higher, and $R^1$ and $R^2$ may be identical to or different from each other and express a saturated or unsaturated hydrocarbon group with a carbon number of 1 to 50. Said hydrocarbon group may be of a linear, branched, or cyclic structure, and may contain an aromatic ring.

In the formula above, 50% or more of the groups represented by $R^1$ and $R^2$ are preferably a methyl group in respect of ink repellency of the printing plate. In addition, in terms of handleability, ink repellency of printing plate and resistance to scratches, the weight-average molecular weight of said organo-polysiloxane containing a vinyl group is preferably 10,000 to 600,000.

The compound containing a SiH group may be an organo-hydrogen polysiloxane or an organic polymer containing a diorgano-hydrogen silyl group, and organo-hydrogen siloxane is preferred. Two or more of these may be contained.

The organo-hydrogen siloxane has a linear, cyclic, branched, or netlike molecular structure, and examples include polymethylhydrogen siloxane with both molecular ends capped with a trimethylsiloxy group dimethylsiloxane-methyl hydrogen siloxane copolymer with both molecular ends capped with a trimethylsiloxy group, dimethylsiloxane-methyl hydrogen siloxane-methyl phenylsiloxane copolymer with both molecular ends capped with a trimethylsiloxy group, dimethylpolysiloxane with both molecular ends capped with a dimethyl hydrogen siloxy group, dimethylsiloxane-methyl phenylsiloxane copolymer with both molecular ends capped with a dimethyl hydrogen siloxy group, methylphenylpolysiloxane with both molecular ends capped with a dimethyl hydrogen siloxy group, organo-polysiloxane copolymer composed of a siloxane unit expressed by the formula $R_3SiO_{1/2}$, a siloxane unit expressed by the formula $R_2HSiO_{1/2}$, and a siloxane unit expressed by the formula $SiO_{4/2}$, organo-polysiloxane copolymer composed of a siloxane unit expressed by the formula $R_2HSiO_{1/2}$ and a siloxane unit expressed by the formula $SiO_{4/2}$, and organo-polysiloxane copolymer composed of a siloxane unit expressed by the formula $RHSiO_{2/2}$, with a siloxane unit expressed by the formula $RSiO_{3/2}$ or a siloxane unit expressed by the formula $HSiO_{3/2}$. Two or more of the organo-polysiloxanes above may be used in combination. In the formulae above, R denotes a monovalent hydrocarbon group other than the alkenyl groups, and it may be of a substituted form. For example, they include alkyl groups such as methyl group, ethyl group, propyl group, butyl group, pentyl group, hexyl group, and heptyl group; aryl groups such as phenyl group, tolyl group, xylyl group, and naphthyl group; aralkyl groups such as benzyl group and phenethyl group; and alkyl halide groups such as chloromethyl group, 3-chloropropyl group, and 3,3,3-trifluoropropyl group.

The organic polymers having a diorgano-hydrogen silyl group include oligomers produced through copolymerization of all acrylic monomer containing a dimethyl hydrogen silyl group, such as dimethyl hydrogen silyl (meth)acrylate and dimethyl hydrogen silylpropyl (meth)acrylate, with another monomer such as methyl (meth)acrylate, ethyl (meth)acrylate, butyl (meth)acrylate, ethylhexyl (meth)acrylate, lauryl (meth)acrylate, styrene, α-methyl styrene, maleic acid, vinyl acetate, and allyl acetate.

The weight percent of said compound having a SiH group preferably accounts for 0.5% or more, more preferably 1% or more, of the silicone rubber layer composition in view of the curing properties of the silicone rubber layer. In addition, the weight percent is preferably 20% or less, more preferably 15% or less.

Examples of the reaction inhibiting agent include nitrogen containing compounds, phosphorous compounds, and unsaturated alcohols, and alcohol containing an acetylenic group is preferred. Two or more of these may be contained in combination. The curing speed of the silicone rubber layer can be adjusted by adding these reaction inhibiting agents. The weight percent of said reaction inhibiting aunt is preferably 0.01% or more, more preferably 0.1% or more, of the silicone rubber layer composition in view of the stability of the silicone lubber layer composition or its solution. In addition, in view of the curing properties of the silicone rubber layer, its weight percent is preferably 20% or less, more preferably 15% or less, of the silicone rubber layer composition.

Known curing catalysts may be used. It is preferably a platinum compound, and specific examples include platinum, platinum chloride, chloroplatinic acid, olefin-coordinated platinum, complex of platinum modified with alcohol, and complex of platinum with methyl vinyl polysiloxane. Two or more of them may be contained in combination. The weight percent of the curing catalyst is preferably 0.001% or more, more preferably 0.01% or more, of the silicone rubber layer composition in respect of the curing properties of the silicone rubber layer. In addition, the weight percent is preferably 20% or less, more preferably 15% or less, of the silicone rubber layer composition in consideration of the stability of the silicone rubber layer composition and its solution.

In addition to these components, the composition may also contain an organo-polysiloxane with a hydroxyl group, silane (or siloxane) with a hydrolytic functional group, a known filler such as silica for increasing strength of rubber, and a known silane coupling agent for improving the adhesiveness. Preferred slime coupling agents include alkoxysilanes, acs and ketoximinosilanes, and especially silane coupling agents with a vinyl group or an allyl group are preferred.

The condensation reaction type silicone rubber layer composition preferably contains at least organo-polysiloxane with a hydroxyl group, a crosslinking agent, and a curing catalyst.

The organo-polysiloxane with a hydroxyl group has a structure expressed by the formula (I) given above, and has a hydroxyl group at the end of the backbone chain or in the backbone chain. Especially, an organo-polysiloxane with a hydroxyl group at the end of the backbone chain is preferred. Two or more of them may be contained in combination.

It is preferable that 50% or more of the groups represented by $R^1$ and $R^2$ in the general formula (I) are a methyl group from the viewpoint of the ink repellency of the priming plate. In respect of handleability, ink repellency of the printing plate, and resistance to scratches, the weight-average molecular weight of said organo-polysiloxane with a hydroxyl group is preferably 10,000 to 600,000.

Examples of the crosslinking agent include silicon compounds such as of deacetic acid type, deoximation type, dealcoholization type, deacetone type, deamidation type, and dehydroxylation amine type, as expressed by the following formula (II).

$$(R^3)_{4-m}SiX_m \qquad (II)$$

In the formula, a denotes an integer of 2 to 4, and the groups represented by $R^3$ may be identical to or different from each other and are a substituted or unsubstituted alkyl group, alkenyl group, or aryl group with a carbon number of 1 or more, or a combination thereof. The groups represented by X are hydrolyzable groups that may be identical to or different from each other. Examples of the hydrolyzable group include acyloxy groups such as acetoxy group; ketoxime groups such as methyl ethyl ketoxime group; alkoxy groups such as methoxy group, ethoxy group, propoxy group, and butoxy group; alkenyloxy groups such as isopropenoxy group; acyl alkyl amino groups such as acetyl ethyl amino group; and aminoxy groups such as dimethyl aminoxy group. In said formula, the number of hydrolyzable groups, m, is preferably 3 or 4.

Specifically, examples of the compound include, but not limited to, acetoxy silanes such as methyl triacetoxy slime, ethyl triacetoxy silane, vinyl triacetoxy silane, allyl triacetoxy silane, phenyl triacetoxy silane, and tetraacetoxy silane; ketoximinosilanes such as vinyl methyl bis(methyl ethyl ketoximino)silane, methyl tris-(methyl ethyl ketoximino)silane, ethyl tris-(methyl ethyl ketoximino)silane, vinyl tris-(methyl ethyl ketoximino)silane, allyl tris-(methyl ethyl ketoximino)silane, phenyl tris-(methyl ethyl ketoximino)silane, and tetrakis (methyl ethyl ketoximino)silane; alkoxysilanes such as methyl trimethoxy slime, methyl triethoxy ethyl trimethoxy silane, ethyl triethoxy silane, tetraethoxy silan, tetrapropoxy silane, vinyl trimethoxy silane, vinyl triethoxy silane, allyl triethoxy slime, and vinyl triisopropoxy silane; alkenyloxy silanes such as vinyl tris-isopropenoxy silane, di-isopropenoxy dimethyl silane, and tri-isopropenoxy methyl silane; and tetra-allyloxy silane. Of these, acetoxy silanes and ketoximino-silanes are preferable in view of the curing properties and handleability of the silicone rubber layer. Two or more of these may be used in combination.

The weight percent of the crosslinking agent in the silicone rubber layer composition is preferably 0.5% or more, more preferably 1% or more, in view of the stability of the silicone rubber layer composition and its solution. In addition, the weight percent is preferably 20% or less, more preferably 15% or less, of the silicone rubber layer composition in consideration of the strength of the silicone rubber layer and resistance to scratches of the printing plate.

Examples of the curing catalyst include organic carboxylic acid, acids, alkali, amine, metal alkoxide, metal diketenate, and organic salt of a metal such as tin, lead, zinc, iron, cobalt, calcium, and manganese. Specific examples include dibutyl tin diacetate, dibutyl tin dioctate, dibutyl tin dilaurate, zinc octylate, and iron octylate. Two or more of them may be contained in combination.

The weight percent of the curing catalyst in the silicone rubber layer composition is preferably 0.001% or more, more preferably 0.01% or more, in view of the curing properties and adhesiveness of the silicone rubber layer. In addition, the weight percent is preferably 15% or less, more preferably 10% or less, in view of stability of the silicone rubber layer composition and its solution.

It is preferable that the silicone rubber layer contains a colored pigment for improving the proofing properties of the waterless planographic printing plate precursor after development. The colored pigment for this invention is a pigment that absorbs light in the visible wavelength range (380 to 780 nm).

Generally, pigments are not soluble in water or a solvent such as aliphatic hydrocarbon. Therefore, if a pigment is added, as compared with adding a dye that is soluble in water or a solvent, extraction of coloring matter by the water or organic chemical solution used during the developing step or by the solvent in inks or various cleaning agents used during the printing step is reduced significantly.

The proofing properties of the waterless planographic printing plate precursor after development refers, for instance, to the easiness of visual, inspection and easiness of mechanical inspection using a dot area value measurement device. Since the image recognition ability of mechanical inspection is generally lower than that of visual inspection, the waterless planographic printing plate precursor, which has good proofing properties for mechanical inspection, also have good proofing properties for visual inspection in many cases.

In a typical dot area value measurement device, blue light (wavelength 400 to 500 nm), green light (wavelength 500 to 600 nm), red light (wavelength 600 to 700 nm), or white light (wavelength 400 to 700 nm) is applied to the halftone dot regions formed on a printing plate, and the dot area values are calculated from the difference between the reflected light from the image areas and that from the non-image areas. Therefore, when there is little or no difference between the reflected light from the image areas and that from the non-image areas, it will be difficult to measure the dot area values, leading to a decrease in the easiness of mechanical inspection. Most of the organic compounds used to form the heat insulating layer and the heat sensitive layer of the waterless planographic printing plate precursor absorb blue light. Therefore, if a silicone rubber layer colored with yellow or orange colored pigments which absorb blue light is used, the difference between the reflected light from the image areas and that from the non-image areas will be small, leading to a decrease in the easiness of mechanical inspection. The easiness of visual inspection may also decrease in some cases. For these reasons, it is preferred to use a colored pigment that absorbs green light or red light to facilitate both mechanical inspection and visual inspection. Of the various colored pigments that absorb green light or red light, those colored pigments with a density of 3 $g/cm^3$ or less are preferred in terms of the dispersibility in the silicone layer. Examples of said colored pigments that absorb green light or red light with a density of 3 $g/cm^3$ or less include cobalt blue, milori blue, hydrous silicate, ultramarine blue, carbon black, textile printing pigments consisting of a body pigment (calcium carbonate powder, settleable calcium carbonate, gypsum, asbestos, clay, silica powder, diatom earth, talc, basic magnesium carbonate, or alumina white) dyed with rhodamine, methyl violet, peacock blue, alkali blue, malachite green, alizarin, or other dyes, as well as alkali blue, aniline black, lithol red, lake red C, brilliant carmine 6B, watchung red, bordeaux 10B, para red, lake red 4R, naphthol red, Cromophtal Scarlett RN, phthalocyanine blue, fast sky blue, phthalocyanine green, anthraquinone-based pigment, perylene red, thiointhgo red, indanthrone blue, qumacridone red, quinacridone violet, dioxazine violet, and naphtol green B. Two or more of them may be contained.

The content of the colored pigment for the waterless planographic printing plate precursor is preferably 0.1 volume percent or more, more preferably 0.2 volume percent or more, in the silicone rubber layer. For the silicone rubber layer to maintain a high ink repellency, it is preferably 20 volume percent or less, more preferably 10 volume percent or less.

To increase the dispersibility of these colored pigments in the silicone rubber layer, it is preferable to add a pigment dispersant to the silicone rubber layer composition. The addition of the pigment dispersant reduces agglutination of said colored pigment that occurs when diluting the silicone rubber layer composition with a solvent or occurs over time in the silicone rubber layer composition or in its solution. The preferable pigment dispersants are those pigment dispersants that can N et the surface of the pigment effectively, and have good compatibility with organo-polysiloxane and low polarity compounds such as the solvents used to dilute a silicone solution containing a colored pigment as described below. A known pigment dispersant may be used if it is as described above. The pigment dispersant may be called surface active agent or surface modifier. Examples of the pigment dispersant include organic complexes of a metal and an organic compound, amine-based pigment dispersants, acid-based pigment dispersants, and nonion surface active agents. In particular, organic complexes of a metal and an organic compound and amine-based pigment dispersants are preferable.

The metals and organic compounds that can form the organic complex include those metals and organic compounds that forms those metal complexes mentioned above as crosslinking agents for the heat sensitive layer. In particular, organic compounds including acid compounds such as carboxylic acid, phosphoric acid and sulfonic acid, as well as diketone, ketoester and diester compounds that can form chelate ring with metals are preferable from the viewpoint of ability for coordination with metals. Specific examples of the organic compound include, but not limited to, the following.

[Chemical formula 1]

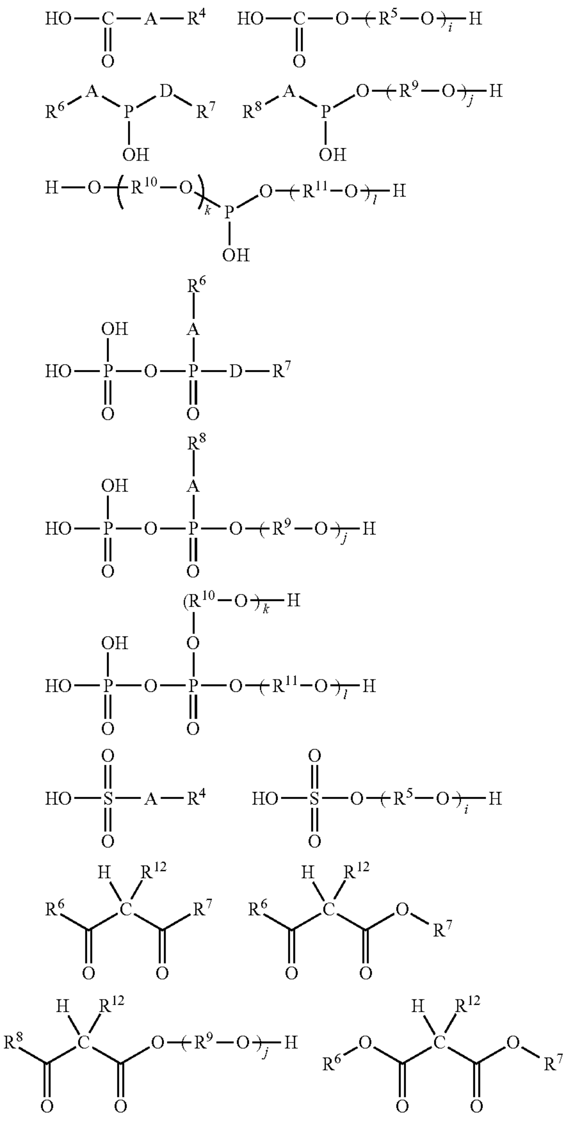

-continued

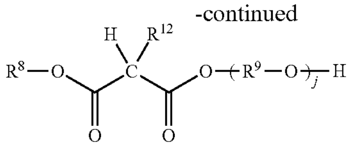

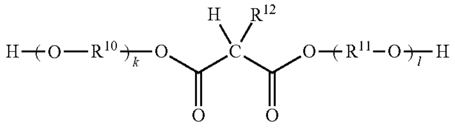

In the formulae above, $R^4$ denotes a saturated or unsaturated monovalent hydrocarbon group, which may be linear, branched, or cyclic, and may contain an aromatic ring. From the viewpoint of dispersibility, it is preferable that $R^4$ contains 8 or more carbons, $R^5$ denotes a saturated or unsaturated divalent hydrocarbon group with 3 or more carbons, and it may be linear, branched, or cyclic. Furthermore, i denotes the number of repetitions, and is an integer of 1 or higher. From the viewpoint of dispersibility, it is preferable that i $R^5$'s contain a to of 8 or more carbons, $R^6$ and $R^7$ denote a saturated or unsaturated monovalent hydrocarbon group, which may be linear, branched, or cyclic, and may contain an aromatic ring. From the viewpoint of dispersibility, it is preferable that the total number of carbons in $R^6$ and $R^7$ is 8 or more. $R^8$ denotes a saturated or unsaturated monovalent hydrocarbon group with one or more carbons, and it may be linear, branched, or cyclic, and may contain aromatic ring. $R^9$ denotes a saturated or unsaturated divalent hydrocarbon group with 3 or more carbons, which may be linear, branched, or cyclic. Furthermore, j denotes the number of repetitions, and is an integer of 1 or higher. From the viewpoint of dispersibility, it is preferable that the total number of carbons included in $R^8$ and j $R^9$'s is 8 or more. $R^{10}$ and $R^{11}$ denote a saturated or unsaturated divalent hydrocarbon groups with 3 or more carbons, which may be linear, branched, or cyclic. Multiple $R^{10}$'s or multiple $R^{11}$'s may be identical to or different from each other. Furthermore, k and l denote the number of repetitions, and each indicates an integer of 1 or higher. From the viewpoint of dispersibility, the total number of carbons contained in k $R^{10}$'s and l $R^{11}$'s is preferably 8 or more. $R^{12}$ denotes a hydrogen, alkyl group or aryl group. A and D denote a divalent group expressed by one of the following formulae, and they may be identical to or different from each other.

[Chemical formula 2]

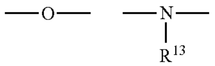

In the formula above, $R^{13}$ denotes a hydrogen, alkyl group, or aryl group.

The simplest organic complex that is used as pigment dispersant is produced by stirring an organic compound as given above and a metal alkoxide at room temperature or elevated temperature for exchange of the ligands. It is preferable to allow coordination of 1 or more molecules of an organic compound as given above to a metal molecule.

Some commercial organic complexes of a metal and an organic compound are listed below. Aluminum-based products include Octope (registered trademark) Al, Oliepe AOO and AOS (supplied by Hope Chemical Co., Ltd.), and Plenact (registered trademark) AL-M (supplied by Ajinomoto Fine Techno Co., Ltd.), and titanium-based products include Plenact (registered trademark) KR-TS, KR46B, KR55, KR41B, KR38S, KR138S, KR238S, KR338X, and KR9SA (supplied by Ajinomoto Fine Techno Co., Ltd.), KEN-REACT (registered trademark) TTS-B, 5, 6, 7, 10, 11, 12, 15, 26S, 37BS, 43, 58CS, 62S, 36B, 46B, 101, 106, 110S, 112S, 126S, 137BS, 158DS, 201, 206, 212, 226, 237, and 262S (supplied by Kenrich Petrochemicals, Inc.)

The organic complexes listed above can be suitably used especially for addition reaction type silicone rubber layers. In particular, since organic complexes free from primary or secondary amines, phosphorous, or sulfur in their molecular structure do not work as a catalytic poison for platinum catalyst, they are very suitable for addition reaction type silicone that uses a platinum catalyst for accelerating the curing.

On the other hand, preferable amine-based pigment dispersants include those of monoamine type that contain one amino group in a molecule and those of polyamine type that contain multiple amino groups in a molecule, both types being suitably used. Specific examples include Solsperse (registered trademark) 9000, 13240, 13650, 13940, 17000, 18000, 19000, and 28000 (supplied by Lubrizol Corporation), and amine compounds expressed by the following general formula.

[Chemical formula 3]

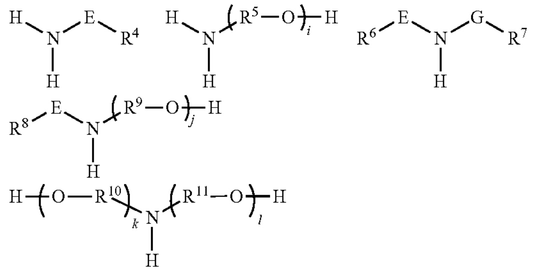

In the formula above, $R^4$ denotes a saturated or unsaturated monovalent hydrocarbon group, which may be linear, branched, or cyclic, and may contain an aromatic ring. From the viewpoint of dispersibility, the number of carbons in $R^4$ is preferably 8 or more. $R^5$ denotes a saturated or unsaturated divalent hydrocarbon group with 3 or more carbons, which may be linear, branched, or cyclic. Furthermore, i denotes the number of repetitions, and is an integer of 1 or higher. From the viewpoint of dispersibility, it is preferable that the total number of carbons contained in i $R^5$'s is 8 or more. $R^6$ and $R^7$ denote a saturated or unsaturated monovalent hydrocarbon group, which may be linear, branched, or cyclic, and may contain an aromatic ring. From the viewpoint of dispersibility, the number of total carbons in $R^6$ and $R^7$ is preferably 8 or more. $R^8$ denotes a saturated or unsaturated monovalent hydrocarbon group with 1 or more carbons, which may be linear, branched, or cyclic, and may contain, an aromatic ring. $R^9$ denotes a saturated or unsaturated divalent hydrocarbon group with 3 or more carbons, which may be linear, branched, or cyclic. Furthermore, j denotes the number of repetitions, and is an integer of 1 or higher. From the viewpoint of dispersibility, the total number of carbons contained in $R^8$ and j $R^9$'s is preferably 8 or more. $R^{10}$ and $R^{11}$ denote a saturated or unsaturated divalent hydrocarbon group with 3 or more carbons, which may be linear, branched, or cyclic. Multiple $R^{10}$'s and $R^{11}$'s may be identical to or different from each other. Furthermore, k and l denote the number of repetitions, and are an integer of 1 or higher. From the viewpoint of dispersibility, the total number of carbons contained in k $R^{10}$'s and $R^{11}$'s is preferably 8 or more. E and G denote a divalent group expressed by one of the following formulae, and they may be identical to or different from each other.

[Chemical formula 4]

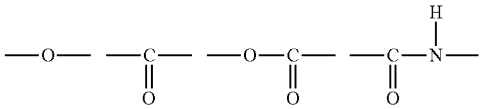

It is preferable to add a pigment dispersant up to 2 to 30 mg per square meter ($m^2$) of the pigment's surface area. In other words, for example, if 10 g of a pigment with an area/weight ratio of 50 $m^2$/g is contained, the preferable amount of the pigment dispersant is 1 to 15 g.

In addition to the components above, known fillers such as silica and known silane coupling agents may be added to improve the rubber strength.

The thickness of the silicone rubber layer in the directly imageable waterless planographic printing plate precursor is preferably 0.5 to 20 g/$m^2$. When the thickness is 0.5 g/$m^2$ or more, the printing plate will have an adequate ink repellency, resistance to scratches, and printing durability, and when the thickness is 20 g/$m^2$ or less, deterioration in developing properties and ink mileage can be depressed without causing a significant economic disadvantage.

A heat insulating layer may be provided on the substrate with the aim of improving adhesiveness between the substrate and the heat sensitive layer, preventing halation, improving proofing properties, improving insulation, improving in printing durability, etc. Examples of the heat insulating layer to be used include, for instance, the heat insulating layers described in Japanese Unexamined Patent Application (Kokai) No. 2004-199016, Japanese Published Unexamined Patent Application (Kokai) No. 2004-334025, and Japanese Unexamined Patent Application (Kokai) No. 2006-276385.

The directly imageable waterless planographic printing plate precursor may contain a protective film and/or inserting paper for protecting the silicone rubber layer.

The protective film is preferably a film with a thickness of 100 μm or less that allows light of the exposure light source wavelength to pass through efficiently. Typical examples include polyethylene, polypropylene, polyvinyl chloride, polyethylene terephthalate, and cellophane. In addition, various light absorbents, photofading materials, or photochromic materials as descried in Japanese Published Unexamined Patent Application No. 1990-063050 may be provided on the protective film to prevent the precursor from reacting when exposed to natural light.

The inserting paper preferably has a weight of 30 to 120 g/$m^2$, more preferably 30 to 90 g/$m^2$. When the weight is 30 g/$m^2$ or more, adequate mechanical strength will be maintained, and when it is 120 g/$m^2$ or less, not only an economic advantage is obtained, but also the laminate consisting of the waterless planographic printing plate precursor and the paper can be decreased in thickness, leading to a higher handleability. Preferable examples of the inserting paper include, but not limited to, information recording base paper 40 g/$m^2$ (supplied by Nagoya Pulp Co., Ltd.), metal inserting paper 30 g/$m^2$ (supplied by Nagoya Pulp Co., Ltd.), unbleached kraft paper 50 g/$m^2$ (supplied by Chuetsu Pulp & Paper Co., Ltd.), NIP paper 52 g/$m^2$ (supplied by Chuetsu Pulp & Paper Co., Ltd.), pure white roll paper 45 g/$m^2$ (supplied by ii paper Co., Ltd.), and Clupak 73 g/$m^2$ (supplied by Oji paper Co., Ltd.).

Described below is the manufacturing method of the directly imageable waterless planographic printing plate precursor. The manufacturing method of the directly imageable waterless planographic printing plate precursor comprises at least: (a) a step of applying a solution of a heat sensitive layer composition containing a solvent with a solubility parameter of 17.0 $(MPa)^{1/2}$ or less and a boiling point in the range of 210 to 270° C. and a solvent with a solubility parameter of more than 17.0 $(MPa)^{1/2}$ over a substrate or a substrate coated with a resin layer, (b) a step of drying said solution of a heat sensitive layer composition to form a heat sensitive layer, and (c) a step of applying a silicone rubber layer composition over said heat sensitive layer to form a silicone rubber layer. Instead of the step (c), it may comprise: (d) a step of applying a solution of a silicone rubber layer composition over said heat sensitive layer, and (e) a step of drying said solution of a silicone rubber layer composition to form a silicone rubber layer.

Described below is the step (a) of applying a solution of a heat sensitive layer composition containing a solvent with a solubility parameter of 17.0 $(MPa)^{1/2}$ or less and a boiling point in the range of 210 to 270° C. and a solvent with a solubility parameter of more than 17.0 $(MPa)^{1/2}$ over a substrate or a substrate coated with a resin layer. The solution of a heat sensitive layer composition contains a solvent with a solubility parameter of 17.0 $(MPa)^{1/2}$; or less and a boiling point in the range of 210 to 270° C. It is required that the solvent with a solubility parameter of 17.0 $(MPa)^{1/2}$ or less and a boiling point in the range of 210 to 270° C. have a low compatibility with the polymer having active hydrogen, and other polymers contained in the heat sensitive layer, and have a low solubility in these polymers. Specifically, it is required that the solubility parameter be 17.0 $(MPa)^{1/2}$ or less, more preferably 16.5 $(MPa)^{1/2}$ or less. When a solvent with a solubility parameter 17.0 $(MPa)^{1/2}$ or less is used, the solubility in the polymers will be low, allowing liquid bubbles to form in the heat sensitive layer (polymer) and allowing the liquid bubbles to maintain their shapes for a long period. The solvent as referred to here is a compound that is liquid at 25° C. at 1 atm and does not react with components of the heat sensitive layer composition such as the polymer having active hydrogen, crosslinking agent, organic complex, and light-to-heat conversion material.

Specific examples of the solvent with a solubility parameter of 17.0 $(MPa)^{1/2}$ or less and a boiling point in the range of 210 to 270° C. include linear, branched, or cyclic hydrocarbons with 12 to 18 carbons; aliphatic saturated hydrocarbons such as Normal Paraffin Grade M (boiling point 219 to 247° C., solubility parameter 16.2 $(MPa)^{1/2}$, supplied by Nippon Oil Corporation), Normal Paraffin Grade H (boiling point 244 to 262° C., solubility parameter 16.2 $(MPa)^{1/2}$, supplied by Nippon Oil Corporation), NS Clean 230 (boiling point 227° C., solubility parameter 16.2 $(MPa)^{1/2}$, supplied by JOMO Sum-Energy Co., Ltd.), Isopar (registered trademark) M (boiling point 223 to 254° C., solubility parameter 14.7 $(MPa)^{1/2}$, supplied by Esso Chemical Co., Ltd.), IP Solvent 2028 (boiling point 213 to 262° C., solubility parameter 14.3 $(MPa)^{1/2}$, supplied by Idemitsu Kosan Co., Ltd.), and IP clean HX (boiling point 222 to 261° C., solubility parameter 14.3 $(MPa)^{1/2}$, supplied by Idemitsu Kosan Co., Ltd.); alicyclic hydrocarbons such as Naphtesol (registered trademark) 220 (boiling point 221 to 240° C., solubility parameter 16.4 $(MPa)^{1/2}$, supplied by Nippon Oil Corporation); and alkylene glycol dialkyl ethers such as diethylene glycol butyl methyl ether (boiling point 212° C., solubility parameter 16.0 $(MPa)^{1/2}$), diethylene glycol dibutyl ether (boiling point 256° C., solubility parameter 15.8 $(MPa)^{1/2}$), trienthylene glycol dimethyl ether (boiling point 216° C., solubility parameter 16.2 $(MPa)^{1/2}$), trienthylene glycol butyl methyl ether (boiling point 261° C., solubility parameter 16.2 $(MPa)^{1/2}$), and tripropylene glycol methyl ether (boiling point 215° C., solubility parameter 15.1 $(MPa)^{1/2}$). Two or more of them may be contained.

Specific examples of the solvent with a solubility parameter of 17.0 $(MPa)^{1/2}$ or less and a boiling point in some part of the range of 210 to 270° C. include Naphtesol (registered trademark) 200 (boiling point 201 to 217° C., solubility parameter 16.2 $(MPa)^{1/2}$, supplied by Nippon Oil Corporation), Dust Clean 300 (boiling point 201 to 217° C., solubility parameter 16.2 $(MPa)^{1/2}$, supplied by Matsumura Oil. Ltd., Co.), Dust Clean 300AF (boiling point 201 to 217° C., solubility parameter 16.2 $(MPa)^{1/2}$, supplied by Matsumura Oil Ltd., Co.), and polyethylene glycol dimethyl ether (boiling point 264 to 294° C., solubility parameter 16.6 $(MPa)^{1/2}$. Two or more of them may be contained.

In the solvent with a solubility parameter of 17.0 $(MPa)^{1/2}$ or less contained in the heat sensitive layer composition solution, those solvent components with a boiling point in the range of 210 to 270° C. preferably account for 80 weight percent or more, more preferably 90 weight percent or more, still more preferably 95 weight percent or more, and most preferably 100 weight percent.

The content of the solvent with a solubility parameter of 17.0 $(MPa)^{1/2}$ or less and a boiling point in the range of 210 to 270° C. is preferably 0.1 part by weight or more, more preferably 1 part by weight or more, per 100 parts by weight of the solid content of the heat sensitive layer, from the viewpoint of improving the initial sensitivity and the sensitivity after the passage of time. On the other hand, from the viewpoint of coatability of the heat sensitive layer composition solution, the content is preferably 60 parts by weight or less, more preferably parts by weight or less, per 100 parts by weight of the solid content of the heat sensitive layer. In addition, from the viewpoint of improving the initial sensitivity and the sensitivity after the passage of time, it preferably accounts for 0.1 weight percent or more, more preferably 0.5 weight percent or more, of the heat sensitive layer composition solution. Or the other hand, from the viewpoint of coatability of the heat sensitive layer composition solution, it preferably accounts for 10 weight percent or less, more preferably 7 weight percent or less, and still more preferably 5 weight percent or less, of the heat sensitive layer composition solution.

The heat sensitive layer composition solution further contains a solvent with a solubility parameter of more than 17.0 $(MPa)^{1/2}$. The solvent with a solubility parameter of more than 17.0 $(MPa)^{1/2}$ preferably has the ability to dissolve or disperse components of the heat sensitive layer. Examples include alcohols, ethers, ketones, esters, and amides. Two or more of them may be contained.

Examples of the alcohols include, for instance, methanol, ethanol, 1-propanol, isopropanol, 1-butanol, isobutanol, 2-butanol, 2-methyl-2-propanol, 1-pentanol, 2-methyl-1-butanol, 3-methyl-1-butanol, 2-pentanoi, 3-pentanol, 2-methyl-2-butanol, 1-hexanol, 2-hexanol, 3-hexanol, 4-methyl-2-pentanol, 2-ethyl butanol, 1-heptanol, 2-heptanol, 3-heptanol, 2,4-dimethyl penta-3-o, 1-octanol, 2-octanol, 2-ethyl hexanol, 1-nonanol, 2,6-dimethyl-4-heptanol, 1-decanol, ethylene glycol, diethylene glycol, triethylene glycol, tetraethylene glycol, propylene glycol, dipropylene glycol, 1,4-butylene glycol, 2,3-butylene glycol, 2-ethyl-1,3-hexanediol, glycerin, benzyl alcohol, α-methylbenzyl alcohol, cyclopentanol, cyclohexanol, methyl cyclohexanol, furfuryl alcohol, and tetrahydrofurfuryl alcohol.

Examples of the ethers include, for instance, ethylene glycol monomethyl ether, ethylene glycol monoethyl ether, ethylene glycol monopropyl ether, ethylene glycol monobutyl ether, ethylene glycol monoethylhexyl ether, ethylene glycol monophenyl ether, ethylene glycol monobenzyl ether, ethylene glycol dimethyl ether, ethylene glycol diethyl ether, ethylene glycol dipropyl ether, ethylene glycol dibutyl ether, diethylene glycol monomethyl ether, diethylene glycol monoethyl ether, diethylene glycol monopropyl ether, diethylene glycol monobutyl ether, diethylene glycol dimethyl ether, diethylene glycol diethyl ether, diethylene glycol dipropyl ether, diethylene glycol dibutyl ether, tetraethylene glycol dim ethyl ether, tetraethylene glycol dibutyl ether, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, tripropylene glycol monomethyl ether, methyl phenyl ether, dimethoxy methane, diethyl acetal, propylene oxide, dioxane, dimethyl dioxane, trioxan, dioxolane, methyl dioxolane, tetrahydrofuran, and tetrahydropyran.

Examples of the ketones include, for instance, acetone, methyl ethyl ketone, methyl propyl ketone, diethyl ketone, methylbutyl ketone, methyl isobutyl ketone, ethyl propyl ketone, ethyl butyl ketone, dipropyl ketone, dibutyl ketone, diisobutyl ketone, methyl pentyl ketone, methyl hexyl ketone, ethyl pentyl ketone, propyl butyl ketone, ethylhexyl ketone, propyl pentyl ketone, propyl hexyl ketone, butyl pentyl ketone, butyl hexyl ketone, dipentyl ketone, pentyl hexyl ketone, dihexyl ketone, methyl isobutenyl ketone, diacetone alcohol, cyclopentanone, cyclohexanone, methyl cyclohexanone, methyl phenyl ketone, isophorone, acetylacetone, and acetonyl acetone.

Examples of the esters include, for instance, methyl formate, ethyl formate, butyl formate, pentyl formate, methyl acetate, ethyl acetate, propyl acetate, isopropyl acetate, butyl acetate, isobutyl acetate, pentyl acetate, hexyl acetate, cyclohexyl acetate, phenyl acetate, propionate methyl, ethyl propionate, propyl propionate, butyl propionate, pentyl propionate, methyl butyrate, ethyl butyrate, butyl butyrate, pentyl butyrate, ethyl crotonate, butyl crotonate, methyl benzoate, ethyl benzoate, benzyl benzoate, methyl lactate, ethyl lactate, propyl lactate, butyl lactate, pentyl lactate, hexyl lactate, cyclohexyl lactate, methyl salicylate, ethyl salicylate, ethylene glycol monomethyl ether acetate, ethylene glycol monoethyl ether acetate, diethylene glycol monomethyl ether acetate, diethylene glycol monoethyl ether acetate, diethylene glycol monobutyl ether acetate, triethylene glycol monomethyl ether acetate, methoxy butyl acetate, dimethyl oxalate, diethyl oxalate, dimethyl malonate, diethyl malonate, dimethyl maleate, diethyl maleate, γ-butyrolactone, γ-valerolactone, ethylene carbonate, propylene carbonate, dimethyl carbonate, and diethyl carbonate.

Examples of the amide include, for instance, dimethyl formamide, dimethyl acetamide, and N-methyl-2-pyrolidone.

Others including methyl carbamate, ethyl carbamate, tetramethyl urea, 1,3-dimethyl-2-imidazolidinone, dimethyl sulfoxide, sulfolane, and acetonitrile may also be contained.

Of the solvents above, those solvents compatible with a liquid with a solubility parameter of 17.0 $(MPa)^{1/2}$ or less and a boiling point in the range of 210 to 270° C. are particularly preferable.

The size of liquid bubbles has close relation with the boiling point of the solution with a solubility parameter of more than 17.0 $(MPa)^{1/2}$ and the ambient temperature for application of the heat sensitive layer composition solution. When a solvent with a low boiling point that evaporates easily at the ambient temperature for application of the heat sensitive layer composition solution is used as the solvent with a solubility parameter of more than 17.0 $(MPa)^{1/2}$, the solution with a low boiling point evaporates rapidly, and it is dried before components to form adjacent liquid bubbles can gather, leading to formation of small liquid bubbles in the heat sensitive layer. On the other hand, when using a solvent with a high boiling point that does not easily evaporate at the ambient temperature for application of the heat sensitive layer composition solution, the solvent with a high boiling point evaporates slowly, and it is dried while components to form adjacent liquid bubbles are gathering, leading to formation of large liquid bubbles in the heat sensitive layer.

In the solvent with a solubility parameter of more than 17.0 $(MPa)^{1/2}$, it is preferable that those solvent components with a boiling point of 30 to 200° C. account for 80 weight percent or more, more preferably 95 weight percent or more. In addition, it is preferable that those solvent components with a boiling point of 80° C. or less account for 80 weight percent or more, more preferably 95 weight percent or more. Furthermore, it is preferable that those solvent components with a boiling point of 70° C. or less account for 80 weight percent or more, more preferably 95 weight percent or more. If solvent components with a boiling point of 3° C. or more account for 80 weight percent or more, preparation of a coating liquid can be performed easily and stably at ambient temperature without using any special cooling device etc. Moreover, if solvent components with a boiling point of 200° C. or less account for 80 weight percent or more, they will be easily removed from the heat sensitive layer in the drying step descried later.

In addition, if the boiling point of the solvent with a solubility parameter of more than 17.0 $(MPa)^{1/2}$ is lower than the thermal softening point of the polymer with active hydrogen, it is advantageous for the formation of liquid bubbles for this invention.

The heat sensitive layer composition solution contains the heat sensitive layer components described above, the solvent with a solubility parameter of 17.0 $(MPa)^{1/2}$ or less and a boiling point in the range of 210 to 270° C., the solvent with a solubility parameter of more than 17.0 $(MPa)^{1/2}$, and other components as necessary. It is preferable that the total content of solid matter in the heat sensitive layer composition solution is 2 to 50 weight percent.

The heat sensitive layer composition, solution described above may be applied directly on the substrate, or it may be applied on a resin layer such as a heat insulating layer formed as required on the substrate. The coating surface of the substrate is preferably degreased.

Examples of coaters include slit die coater, direct gravure coater, offset gravure coater, reverse roll coater, natural roll coater, air knife coater, roll blade coater, Vari-Bar roll blade coater, two stream coater, rod coater, dip coater, curtain coater, and spin coater. From the viewpoint of the coating accuracy, productivity, and cost, slit die coater, gravure coater, and roll coater are particularly preferable.

The suitable coating weight of the heat sensitive layer composition solution is 0.1 to 10 $g/m^2$, preferably 0.5 to 7 $g/m^2$, after drying, from the viewpoint of printing durability of the printing plate, volatilization of the diluting solvent, mid productivity.

Described next is the step (b) of drying said solution of a heat sensitive layer composition to form a heat sensitive layer. The step of drying the heat sensitive layer composition solution is performed under unheated or heated conditions. When it is heated, it is preferable to heat it in the temperature range of 30 to 190° C., more preferably 50 to 150° C., for 30 seconds to 5 minutes using a hot air drier, infrared drier, etc.

Described next are the step (c) of applying a silicone rubber layer composition on the heat sensitive layer to form a silicone rubber layer, the step (d) of applying a solution of a silicone rubber layer composition on the heat sensitive layer, and the step (e) of drying the solution of a silicone rubber layer composition to form a silicone rubber layer. The silicone rubber layer composition as referred to here is a solventless liquid comprising the components to form the silicone rubber layer, and the silicone rubber layer composition solution is a diluted solution containing the silicone rubber layer composition and a solvent.

The solvents used for dispersion of colored pigments or preparation of the silicone rubber layer composition solution are, for example, aliphatic saturated hydrocarbon, aliphatic unsaturated hydrocarbon, alicyclic hydrocarbon, halogenated hydrocarbon, and ethers. The solubility parameter of these solvents is preferably 17.0 $(MPa)^{1/2}$ or less, more preferably 15.5 $(MPa)^{1/2}$ or less. Examples include aliphatic saturated hydrocarbons such as hexane, heptane, octane, nonane, decane, undecane, dodecane, isooctane, Isopar (registered trademark) C, Isopar (registered trademark) E, Isopar (registered trademark) G, Isopar (registered trademark) H, Isopar (registered trademark) K, Isopar (registered trademark) L, and Isopar (registered trademark) M (supplied by Exxon Chemical Company); unsaturated aliphatic hydrocarbons such as hexene, heptene, octene, nonene, and decene; alicyclic hydrocarbons such as cyclopentane, cyclohexane, and methylcyclohexane; halogenated hydrocarbons such as trifluorotrichloroethane; and ethers such as diethyl ether, diisopropyl ether, and diisobutyl ether. Two or more of them may be used in combination. From the viewpoint of economic efficiency and safety, aliphatic or alicyclic hydrocarbons are preferable. The number of carbons in these aliphatic or alicyclic hydrocarbons is preferably 4 to 20, more preferably 6 to 15.

Specific preparation methods for (i) silicone rubber layer composition and (ii) silicone rubber layer composition solution are described below, (i) Silicone Rubber Layer Composition (Solventless)

A silicone paste is prepared by performing uniform dispersion mixing of, or example, organo-polysiloxane containing a hydroxyl group or a vinyl group, and as necessary, a colored pigment, pigment dispersant, and fine particles using a dispersing device. Examples of the dispersing device include three roll mill, ball mill, bead mill, sand mill, disperser, homogenizer, attriter, and ultrasonic disperser. A crosslinking agent, catalyst, and as necessary, other additives (such as reaction inhibitor) are added to the resulting silicone paste, and stirred to disperse the components uniformly, followed by removal of air bubbles mixed in the liquid to provide a silicone rubber layer composition. This removal of air bubbles may be performed by natural degassing or by vacuum degassing, but vacuum degassing is more preferable.

(ii) Silicone Rubber Layer Composition Solution (Containing a Solvent)

A silicone paste is prepared by performing uniform dispersion mixing of, for example, organo-polysiloxane containing a hydroxyl group or a vinyl group, and as necessary, a colored pigment, pigment dispersant, and fine particles using the dispersing device, followed by diluting it with a solvent while stirring it. Preferably, it is filtered using a common filter such as paper, plastic, and glass to remove impurities (such as large particles of colored pigments that have not dispersed sufficiently) from the diluted solution. It is preferable to remove moisture from the diluted solution by bubbling with dry air or dry nitrogen after filtering. After removing moisture sufficiently, a crosslinking agent, catalyst, and as necessary, other additives (such as a reaction inhibitor) are added to the diluted solution, and stirred to achieve uniform dispersion of the components, followed by removal of air bubbles mixed in the liquid. This removal of air bubbles may be performed by natural degassing or by vacuum degassing.

Another preparation method for the silicone rubber layer composition solution containing a colored pigment is preparing a colored pigment dispersion and separately preparing a silicone liquid or diluted silicone solution beforehand, and mixing the two liquids subsequently. The colored pigment dispersion is prepared by adding a colored pigment, and fine particles if necessary, to a solution containing at least a pigment dispersant and a solvent, and performing dispersion mixing with a dispersing device to achieve uniformity. On the other hand, the silicone liquid can be prepared by mixing organo-polysiloxane containing a hydroxyl group or a vinyl group, a crosslinking agent, catalyst, and as necessary, other additives (such as reaction inhibitor). A diluted silicone solution can be prepared by diluting the resulting silicone liquid with a solvent.

It is preferable to remove moisture adhered on the surface of the heat sensitive layer as much as possible when applying the silicone rubber layer composition or the silicone rubber layer composition solution, from the viewpoint of adhesiveness. As a specific method, the silicone rubber layer composition or the silicone rubber layer composition solution may be applied in a space where moisture has been removed by filling it with dry gas or continuously supplying dry gas.

After a silicone rubber layer composition solution is applied, the silicone rubber layer composition solution is dried subsequently to form a silicone rubber layer. Heating may be performed for drying or curing. It is preferable that the silicone rubber layer composition or the silicone rubber layer composition solution is heated immediately after the application to achieve better curing properties and adhesion to the heat sensitive layer.

For protection of the plate surface during storage, it is preferable to provide protective film and/or inserting paper on the resulting directly imageable waterless planographic printing plate precursor.

Next, the manufacturing method for the waterless planographic printing plate is described below. The waterless planographic printing plate as referred to herein is a printing plate having a patterned silicone rubber layer on the surface to work as an in repelling layer. The printing plate is used in a printing process in which the patterned silicone rubber layer is used as non-image area and the silicone-rubber-free part as image area, and the difference in adherence to ink between the non-image area and the image area is made use of so that the ink is attached only to the image area and transferred to the printing material such as paper. The production method for the waterless planographic printing plate comprises a step of exposing the directly imageable waterless planographic printing plate precursor of this invention to laser beam according to the image pattern (exposure step) and a step of applying friction to the exposed directly imageable waterless planographic printing plate precursor in the presence of water or a liquid consisting of water and a surface active agent to remove the silicone rubber layer from the exposed area (development step). Thus, the directly imageable waterless planographic printing plate precursor serves to produce a directly imageable waterless planographic printing plate without using a solvent.

The exposure step is performed as follows. The directly imageable waterless planographic printing plate precursor of this invention is exposed to laser beam that scans it according to an image pattern of digital data. If the directly imageable waterless planographic printing plate precursor has a protective film, the exposure may be performed through the protective film or after peeling off the protective film. The light source used for the exposure step may be a laser with an emission wavelength in the range of 300 nm to 1,500 nm. In particular, a semiconductor laser or a YAG laser with an emission wavelength near the near-infrared region is preferred. Specifically, a laser with a wavelength of 780 nm, 830 nm, or 1,064 nm is used preferably for the plate processing step from the viewpoint of handleability in a bright room, etc.

The developing step is described below. Friction is applied to the exposed precursor in the presence of water or a liquid consisting of water and a surface active agent (hereinafter called developer) to remove the silicone rubber layer from the exposed area. The friction step may be carried out by (i) the method of wiping the plate surface with unwoven cloth, absorbent cotton, cloth, or sponge dampened with a developer, (ii) the method of scrubbing the plate surface with a rotary brush in a shower of tap water etc. after pre-treatment of the plate surface with a developer, or (iii) the method of applying a pressured jet of water, warm water, or steam to the plate surface, etc.

Before development, pre-treatment of soaking the plate in a pre-treatment liquid for a certain period may be conducted. The pre-treatment liquid may be water; water containing a polar solvent such as alcohol, ketone, ester, and carboxylic acid; at least one solvent such as aliphatic hydrocarbon and aromatic hydrocarbon containing a polar solvent; or a polar solvent. In addition, a known surface active agent may be added appropriately to said developer composition. It is preferable to use a surface active agent that forms a solution of pH 5 to 8 when added to water from the viewpoint of safety, cost for disposal, etc. The content of the surface active agent in the developer is preferably 10 weight percent or less. Such a developer has a high level of safety and also economic efficiency in terms of disposal cost, etc. In addition, it preferably comprises a glycol compound or a glycol ether compound as the main component, and more preferably coexists with an amine compound.

The pre-treatment liquid and developer may be a pre-treatment liquid or a developer as described in Japanese Unexamined Patent Application No. 1988-179361, Japanese Published Unexamined Patent Application No. 1992-163557, Japanese Unexamined Patent Application No. 1992-343360, Japanese Unexamined Patent Application No. 1997-34132, or Japanese Patent Registration No. 3716429. Specific examples of said pre-treatment liquid include PP-1, PP-3, PP-F, PP-FII, PTS-1, PH-7N, CP-1, NP-1, and DP-1 (supplied by Toray Industries Inc.).

In addition, a dye such as crystal violet, victoria pure blue, and astrazon red may be added to said developer so that the ink acceptable layer of the image area is colored at the time of development to improve visibility of the image area and accuracy of dot area measurement. It is also preferably to use a liquid containing the dyes to perform dying (post-treatment) after the development step.

Some or entire part of the development step may be performed automatically with an automatic development apparatus. The automatic development apparatus may be a device only with a development unit, a device with a pre-treatment unit and a development unit installed in this order, a device with a pre-treatment unit, a development unit, and an post-treatment unit installed in this order, or a device with a pre-treatment unit, a development unit, a post-treatment unit, and a water washing unit installed in this order. Specific examples of the automatic development apparatus include TWL-650 series, TWL-860 series, TWL-1160 series (supplied by Toray Industries Inc.), and the automatic development apparatuses disclosed in Japanese Unexamined Patent Application No. 1992-2265, Japanese Unexamined Patent Application No. 1993-2272, and Japanese Unexamined Patent Application No. 1993-6000, which may be used alone or in combination.

When piling up printing plates for storage after the development step, it is preferable to use inserting paper between the plates to protect them.

EXAMPLES

Our precursors and methods are described more specifically below with reference to Examples. The evaluations in each Example and Comparative example were performed by the methods described below.

(1) Initial Evaluation

The directly imageable waterless planographic printing plate precursor was prepared and stored at room temperature (about 25° C.) for 1 week, and observation of liquid bubbles, analysis of liquid bubbles, and evaluation of sensitivity were performed according to the methods described in (1-1) to (1-3) below.

(1-1) Observation of Liquid Bubbles

A sample was prepared by ultrathin sectioning form the directly imageable waterless planographic printing plate precursor before laser irradiation. A cross section of the heat sensitive layer was observed using a transmission electron microscope H-1700FA (supplied by Hitachi, Ltd.) at an accelerating voltage of 100 kV and a magnification of 2,000×, A gray-scale TEM picture was examined to determine if there were white circular regions (corresponding to the cross sections of liquid bubbles) in the gray background of the heat sensitive layer.

(1-1-1) Number of Liquid Bubbles

The total number of circular regions with diameter 0.01 μm or more was counted in a 12 $\mu m^2$ portion of the cross section of the heat sensitive layer (thickness of the heat sensitive layer 1.2 μm×width of observation 10 μm) and in a 5 $\mu m^2$ upper portion of the cross section of the heat sensitive layer (depth from the surface of the heat sensitive layer, i.e., the interface with the silicone rubber layer, 0.5 μm×width of observation 10 μn). A circle on the border of the observation area was counted if a half or more of the circle was in the observation area, and was not counted if only less than a half of the circle was in the area.

(1-1-2) Average Diameter of Liquid Bubbles

Of the observed circular regions, 30 circular regions with high whiteness and clear contours (each corresponding to the cross section that passes through virtually the center of a liquid bubble) were randomly selected, and their diameters were measured, followed by calculating the number average diameter, which was taken as their average diameter. If the TEM picture did not contain 30 circular regions with high whiteness and clear contours, 30 circular regions with high whiteness and clear contours were randomly selected from two or more TEM pictures taken of different parts, and the average diameter was calculated.

(1-2) Analysis of Liquid Bubbles (1-2-1) Pre-Treatment-Gas Chromatography/Mass Measurement The directly imageable waterless planographic printing plate precursor was cut to produce a 1 $cm^2$ specimen (1×1 cm square), which was put in a glass container for heating, and heated at 320° C. for 20 minutes while supplying nitrogen gas (flow rate 100 ml/min), followed by collecting the generated gas in an adsorption tube (for JTD505II). The adsorption tube was heated at 320° C. for 15 minutes, and the thermally desorbed gas components were analyzed by gas chromatography/mass measurement method. A glass container was analyzed under the same condition to provide a blank value.

(1-2-2) Conditions for Gas Chromatography/Mass Measurement

Thermal desorption device: JTD50511 (supplied by Japan Analytical Industry Co., Ltd.)

Secondary thermal desorption temperature: 340° C., 180 seconds

Gas chromatograph device: HP5890 (supplied by Hewlett Packard)

Column: DB-5 (supplied by J& W) 30 m×0.25 mm ID, film thickness 0.5 μm, U.S. Pat. No. 7,119,416H Column temperature: 40° C. (4 minutes) up to 340° C. (rate of heating: 10° C./min)

Mass measurement device: JMS-SX102A mass spectrometer (supplied by JEOL Ltd.)

Ionization method: EI

Scanning range: m/z 10 to 500 (1.2 sec/scan)

TIC mass range: m/z 29 to 500

(1-2-3) Preparation of Calibration Curve

The solvent with a solubility parameter of 17.0 $(MPa)^{1/2}$ or less used in each Example or Comparative example is collected in a measuring flask to prepared a standard solution (3,375 μg/ml, 5,095 μg/ml, 30,265 μg/ml). A 1 μl portion was taken from each standard solution, and analyzed under the same conditions as for the specimens, and a calibration curve was prepared from the relationship between the absolute volume of the poured solvent with a solubility parameter of 17.0 $(MPa)^{1/2}$ or less and the peak area observed in gas chromatography/mass-measuring total ion chromatogram.

(1-3) Sensitivity Evaluation

The polypropylene film was peeled off from the directly imageable waterless planographic printing plate precursor prepared, and then it was attached to a plate processor GX-3600 (supplied by Toray Industries Inc.), and subjected to image exposure using a semiconductor laser (wavelength 830 nm) with an irradiation energy of 70 to 250 $mJ/cm^2$ (in 5 $mJ/cm^2$ increments) to produce laser-irradiated 1 to 99% dots with a resolution of 2,400 dpi (175 lines per inch). Using an automatic development apparatus TWL-860KII (supplied by Toray industries Inc.), development was carried out at a plate-passing speed of 80 cm/min under the condition of (i) using no liquid for pre-treatment, tap water as developer (room temperature), and tap water as post-treatment liquid (room temperature) (tap water development) and under the condition of (ii) using tetraethylene glycol as pre-treatment liquid (30° C.), tap water as developer (room temperature), and post-treatment liquid for development NA-1 (supplied by Toray Industries Inc., room temperature) as post-treatment liquid (pre-/post-treatment liquid development). Through this series of operations, the directly imageable waterless planographic printing plate was deprived of the silicone rubber layer in the laser irradiated areas.

The resulting printing plate was observed with an optical microscope Eclipse L200 (supplied by Nikon Corporation) at a magnification of 100× (objective 10×, eyepiece 10×), and the minimum irradiation energy required to reproduce 1% to 99% dots was taken as sensitivity. A plate was assumed to have a sufficient sensitivity if it was 170 mJ/$cm^2$ or less in the case of tap water development, or 120 mJ/$cm^2$ or less in the case of pre-/post-treatment development.

(2) Evaluation after the Passage of Time

After 1 month storage at 50° C., the directly imageable waterless planographic printing plate precursor was subjected to observation of liquid bubbles, analysis of liquid bubbles, and evaluation of sensitivity by the methods described in (1-1) to (1-3) above.

Example 1

A heat insulating layer composition solution as described below was applied over a degreased aluminum substrate (supplied by Mitsubishi Aluminum Co., Ltd.) with a thickness of 0.24 mm, and dried at 20° C. for 90 seconds to produce a heat insulating layer with a film thickness of 10 g/$m^2$.

<Heat Insulating Layer Composition Solution>

(a) Polymer with active hydrogen:

Epoxy resin: Epikote (registered trademark) 1010 (supplied by Japan Epoxy Resins Co., Ltd.): 35 parts by weight (b) Polymer with active hydrogen:

Polyurethane: Sanprene (registered trademark) LQ-T1331D (supplied by Sanyo Chemical industries Ltd., solid content 20 wt %): 375 parts by weight (c) Aluminum chelate Aluminum Chelate ALCH-TR (supplied by Kawaken Fine Chemicals Co., Ltd.): 10 parts by weight (d) Leveling agent:

Disparlon (registered trademark) LC951 (supplied by Kusumoto Chemicals Ltd., solid content: 10 wt %): 1 part by weight (e) Titanium oxide:

Tipaque (registered trademark) CR-50 (supplied by Ishihara Sangyo Kaisya, Ltd.) dispersed in N,N-dimethyl formamide (titanium oxide 50 wt %): 60 parts by weight (f) N,N-dimethyl formamide: 730 parts by weight (g) Methyl ethyl ketone: 250 parts by weight Then, a heat sensitive layer composition solution as described below was applied over the heat insulating layer, and heated at 12° C. for 30 seconds to produce a heat sensitive layer with a film thickness of 1.5 g/$m^2$.

<Heat Sensitive Layer Composition Solution>

(a) Infrared ray absorption dye: Project 825LDI (supplied by Avecia Limited): 10 parts by weight (b) Organic complex compound:

Titanium di-n-butoxide bis(2,4-pentane dionate): Nãcem (registered trademark) Titanium (supplied by Nihon Kagaku Sangyo Co., Ltd., concentration 73 wt %, n-butano with boiling point 117° C. and solubility parameter 23.3 $(MPa)^{1/2}$ 17 wt % contained as solvent): 11 parts by weight (c) Phenol formaldehyde novolac resin: Sumilite Resin (registered trademark) PR50731 (supplied by Sumitomo Bakelite Co., Ltd., softening point 95° C.): 75 parts by weight (d) Polyurethane: Nippolan (registered trademark) 5196 (Nippon Polyurethane Industry Co., Ltd.) (concentration 30 wt %, containing methyl ethyl ketone with boiling point 80° C. and solubility parameter 19.0 $(MPa)^{1/2}$ 35 wt % and cyclohexanon with boiling point 155° C. and solubility parameter 20.3 $(MPa)^{1/2}$ 35 wt % as solvent): 20 parts by weight (e) Methyl ethyl ketone (boiling point 80° C., solubility parameter 19.0 $(MPa)^{1/2}$): 434 parts by weight (f) Ethanol (boiling point 78° C., solubility parameter 26.0 $(MPa)^{1/2}$): 85 parts by weight (g) Liquid with a solubility parameter of 17.0 $(MPa)^{1/2}$ or less and a boiling point in the range of 210 to 270° C.:

Aliphatic saturated hydrocarbon: Isopar (registered trademark) M (supplied by Esso Chemical Co., Ltd., boiling point 223 to 254° C., solubility parameter 14.7 $(MPa)^{1/2}$): 5 parts by weight This heat sensitive layer composition solution has a solid content of 15.5 wt %, and the content of the liquid with a solubility parameter of 17.0 $(MPa)^{1/2}$ or less and a boiling point of 21 to 270° C. is 0.78 wt %.

Subsequently, a silicone rubber layer composition solution 1 as described below that had been prepared immediately before coating was applied over the heat sensitive layer, and heated at 130° C. for 90 seconds to produce a silicone rubber layer with a film thickness of 2.0 g/$m^2$. The silicone rubber layer immediately after being heated had been cured completely. The silicone rubber layer immediately after being heated was coated with Torayfan polypropylene film (supplied by Toray Industries, Inc.) up to a film thickness of 6 μm to produce a directly imageable waterless planographic printing plate precursor.

<Silicone Rubber Layer Composition Solution 1>

The components (a) to (c) listed below were dispersed in a Star Mill (registered trademark) MINICER bead mill (supplied by Ashizawa Finetech Co., Ltd.) filled with zirconia, beads (diameter 0.3 mm) to prepare a milori blue dispersion liquid. Elsewhere, the components (d) to (h) were mixed to prepare a diluted silicone solution. The diluted silicone solution was added to the milori blue dispersion liquid while stirring well to provide a uniform solution. The resulting liquid was deaerated naturally.

(a) Milori Blue N650 (supplied by Dainichiseika Color & Chemicals Mfg. Co., Ltd.): 4 parts by weight (b) Plenact (registered trademark) KR-TTS (supplied by Ajinomoto Fine-Techno Co., Inc.): 1.5 parts by weight (c) Isopar (registered trademark) CG (supplied by Esso Chemical Co., Ltd.): 83 parts by weight (d) α,ω-divinyl polydimethyl siloxane: DMS V52 (weight average molecular weight 155,000, supplied by Gelest Inc.): 83 parts by weight (e) Methyl hydrogen siloxane SH 1107 (supplied by Dow Corning Toray Co., Ltd.): 4 parts by weight (f) Vinyl tris-(methylethyl ketoxyimino)silane: 3 parts by weight (g) Platinum catalyst SRX 212 (supplied by Dow Corning Toray Co., Ltd.): 6 parts by weight (h) Isopar (registered trademark) E (supplied by Esso Chemical Co., Ltd.): 817 parts by weight For the resulting directly imageable waterless planographic printing plate precursor, the cross section of the heat sensitive layer was observed by the above-mentioned methods, and 35 and 15 circular regions were found in a 12 $μm^2$ portion of the cross section of the heat sensitive layer and in a 5 $μm^2$ upper portion of the cross section of the heat sensitive layer, respectively. The circular regions had an average diameter of 0.20 μm.

The liquid bubbles were analyzed by the above-mentioned methods, and it was found that they contained a liquid derived from Isopar M that had a boiling point in the range of 223 to 254° C. The quantity of the Isopar M derived liquid generated as gas was 6.83 μg. This quantity corresponds with the volume of liquid bubbles estimated from the ratio of circular regions in the observed cross section, suggesting that the circular regions seen in the cross section of the heat sensitive layer were liquid bubbles of the Isopar M derived liquid with a boiling point in the range of 223 to 254° C.

The sensitivity was evaluated by the above-mentioned methods, and it was found that 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Evaluation was carried out by the above-mentioned methods after the passage of time, and 35 and 15 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 6.85 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Example 2

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight (f) Ethanol: 85 parts by weight (g) A liquid with a solubility parameter of 17.0 (MPa)$^{1/2}$ or less and a boiling point of 210 to 270° C.: aliphatic saturated hydrocarbon Isopar (registered trademark) M (supplied by Esso Chemical Co., Ltd., boiling point 223 to 254° C., solubility parameter 14.7 (MPa)$^{1/2}$): 10 parts by weight This heat sensitive layer composition solution has a solid content of 15.5 wt %, and contains a liquid with a solubility parameter of 17.0 (MPa)$^{1/2}$ or less and a boiling point of 210 to 270° C. at a concentration of 1.56 wt %.

Initial evaluation was carried out by the same procedure as in Example 1, and 75 and 30 circular regions were found in a 12 μm$^2$ portion of the cross section of the heat sensitive layer and in a 5 μm upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 13.10 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Evaluation was carried out after the passage of time, and 75 and 30 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 13.07 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Example 3

Except that the following solvent components (e) to (g) were used for the heat sensitive layer composition solution, the same procedure as in Example 1 was carried out to produce an imageable waterless planographic printing plate precursor.

(e) Methyl ethyl ketone: 419 parts by weight (f) Ethanol: 85 parts by weight (g) A liquid with a solubility parameter of 17.0 (MPa)$^{1/2}$ or less and a boiling point of 210 to 270° C.: aliphatic saturated hydrocarbon Isopar (registered trademark) M (supplied by Esso Chemical Co., Ltd., boiling point 223 to 254° C., solubility parameter 14.7 (MPa)$^{1/2}$): 20 parts by weight This heat sensitive layer composition solution has a solid content of 15.5 wt %, and contains a liquid with a solubility parameter of 17.0 (MPa)$^{1/2}$ or less and a boiling point of 210 to 270° C. at a concentration of 3.13 wt %.

Initial evaluation was carried out by the same procedure as in Example 1, and 145 and 60 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 23.99 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Evaluation was carried out after the passage of time, and 145 and 60 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 23.98 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Example 4

Except that the following solvent components (e) to (g) were used for the heat sensitive layer composition solution, the same procedure as in Example 1 was carried out to produce an imageable waterless planographic printing plate precursor.

(e) Methyl ethyl ketone: 409 parts by weight (f) Ethanol: 85 parts by weight (g) A liquid with a solubility parameter of 17.0 $(MPa)^{1/2}$ or less and a boiling point of 210 to 270° C.: aliphatic saturated hydrocarbon: Isopar (registered trademark) M (supplied by Esso Chemical Co., Ltd., boiling point 223 to 254° C., solubility parameter 14.7 $(MPa)^{1/2}$): 30 parts by weight This heat sensitive layer composition solution has a solid content of 15.5 wt %, and contains a liquid with a solubility parameter of 17.0 $(MPa)^{1/2}$ or less and a boiling point of 210 to 270° C. at a concentration of 4.69 wt %.

Initial evaluation was carried out by the same procedure as in Example 1, and 180 and 75 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 28.75 μg. The sensitivity was evaluated, and 1 to 99% dots were reproduced on the printing plate subjected to irradiation at an energy of 150 $mJ/cm^2$ and tap water development and on the printing plate subjected to irradiation at an energy of 100 $mJ/cm^2$ and pre-/post-treatment development, demonstrating a high sensitivity and a high image reproducibility.

Evaluation was carried out after the passage of time, and 180 and 75 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 28.79 μg. The sensitivity was evaluated, and 1 to 99% dots were reproduced on the printing plate subjected to irradiation at an energy of 150 $mJ/cm^2$ and tap water development and on the printing plate subjected to irradiation at an energy of 100 $mJ/cm^2$ and pre-/post-treatment development, demonstrating a high sensitivity and a high image reproducibility.

Example 5

Except that the following solvent components (e) to (g) were used for the heat sensitive layer composition solution, the same procedure as in Example 1 was carried out to produce an imageable waterless planographic printing plate precursor.

(e) Methyl ethyl ketone: 399 parts by weight (f) Ethanol: 85 parts by weight (g) A liquid with a solubility parameter of 17.0 $(MPa)^{1/2}$ or less and a boiling point of 210 to 270° C.: aliphatic saturated hydrocarbon Isopar (registered trademark) M (supplied by Esso Chemical Co., Ltd., boiling point 223 to 254° C., solubility parameter 14.7 $(MPa)^{1/2}$): 40 parts by weight This heat sensitive layer composition solution has a solid content of 15.5 wt %, and contains a liquid with a solubility parameter of 17.0 $(MPa)^{1/2}$ or less and a boiling point of 210 to 270° C. at a concentration of 6.25 wt %.

Initial evaluation was carried out by the same procedure as in Example 1, and 190 and 80 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 30.25 μg. The sensitivity was evaluated, and 1 to 99% dots were reproduced on the printing plate subjected to irradiation at an energy of 150 $mJ/cm^2$ and tap water development and on the printing plate subjected to irradiation at an energy of 100 $mJ/cm^2$ and pre-post-treatment development, demonstrating a high sensitivity and a high image reproducibility.

Evaluation was carried out after the passage of time, and 190 and 80 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M derived liquid generated as gas was 30.25 μg. The sensitivity was evaluated, and 1 to 99% dots were reproduced on the printing plate subjected to irradiation at an energy of 150 $mJ/cm^2$ and tap water development and on the developed printing plate subjected to irradiation at an energy of 100 $mJ/cm^2$ and pre-/post-treatment development, demonstrating a high sensitivity and a high image reproducibility.

Example 6

Except that the following solvent components (e) to (g) were used for the heat sensitive layer composition solution, the same procedure as in Example 1 was carried out to produce an imageable waterless plan graphic printing plate precursor.

(e) Methyl ethyl ketone: 389 parts by weight (f) Ethanol: 85 parts by weight (g) A liquid with a solubility parameter of 17.0 $(MPa)^{1/2}$ or less and a boiling point of 210 to 270° C.: aliphatic saturated hydrocarbon: Isopar (registered trademark) M (supplied by Esso Chemical Co., Ltd., boiling point 223 to 254° C., solubility parameter 14.7 $(MPa)^{1/2}$): 50 parts by weight This heat sensitive layer composition solution has a solid content of 15.5 wt %, and contains a liquid with a solubility parameter of 17.0 $(MPa)^{1/2}$ or less and a boiling point of 210 to 270° C. at a concentration of 7.81 wt %.

In the resulting directly imageable waterless planographic printing plate precursor, the film thickness was slightly ununiform in some portions of the heat sensitive layer contained, but the heat sensitive layer composition solution had a sufficiently high spreadability.

Initial evaluation was carried out by the same procedure as in Example 1, and 190 and 80 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. From temperature programmed desorption mass spectrometry, it was found that they contained an Isopar M derived liquid with a boiling point in the range of 223 to 254° C. The quantity of the Isopar M derived liquid generated as gas was 30.22 μg. The sensitivity was evaluated, and 1 to 99% dots were reproduced on the printing plate subjected to irradiation at an energy of 150 $mJ/cm^2$ and tap water development and on the printing plate subjected to irradiation at an energy of 100 $mJ/cm^2$ and pre-/post-treatment development, demonstrating a high sensitivity and a high image reproducibility.

Evaluation was carried out after the passage of time, and 190 and 80 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. The liquid bubbles were analyzed, and it was found that they contained an Isopar M derived liquid with a boiling point in the range of 223 to 254° C. The quantity of the Isopar M: derived liquid generated as gas was 30.26 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Example 7

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight
(f) Ethanol: 85 parts by weight
(g) A liquid with a solubility parameter of 17.0 (MPa)$^{1/2}$ or less and a boiling point of 210 to 270° C.: aliphatic saturated hydrocarbon: IP Solvent (registered trademark) 2028 (supplied by Idemitsu Kosan Co., Ltd., boiling point 213 to 262° C., solubility parameter 14.3 (MPa)$^{1/2}$): 10 parts by weight This heat sensitive layer composition solution has a solid content of 15.5 wt %, and contains a liquid with a solubility parameter of 17.0 (MPa)$^{1/2}$ or less and a boiling point of 210 to 270° C. at a concentration of 1.56 wt %.

Initial evaluation was carried out by the same procedure as in Example 1, and 75 and circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an IP Solvent 2028 derived liquid with a boiling point in the range of 213 to 262° C.:. The quantity of the IP Solvent 2028 derived liquid generated as gas was 13.04 μg. The sensitivity was evaluated, and 1 to 99% dots were reproduced on the printing plate subjected to irradiation at an energy of 150 nm/cm$^2$ and tap water development and on the printing plate subjected to irradiation at an energy of 100 mJ/cm$^2$ and pre-/post-treatment development, demonstrating a high sensitivity and a high image reproducibility.

Evaluation was carried out after the passage of time, and 75 and 30 circular regions were found in a 12 μm$^2$ portion of the cross section of the heat sensitive layer and in a 5 μm$^2$ upper portion of the cross section of the beat sensitive layer, respectively. The circular regions had an average diameter of 0.20 μm. The liquid bubbles were analyzed, and it was found that they contained an IP Solvent 2028 derived liquid with a boiling point in the range of 213 to 262° C. The quantity of the IP Solvent 2028 derived liquid generated as gas was 13.08 g. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Example 8

Except that the following solvent components (e) to (g) were used for the heat sensitive layer composition solution, the same procedure as in Example 1 was carried out to produce an imageable waterless planographic printing plate precursor, (e) Methyl ethyl ketone: 429 parts by weight
(f) Ethanol: 85 parts by weight
(g) A liquid with a solubility parameter of 17.0 (MPa)$^{1/2}$ or less and a boiling point of 210 to 270° C.: aliphatic saturated hydrocarbon: IP Clean (registered trademark) HX (supplied by Idemitsu Kosan Co., Ltd., boiling point 222 to 261° C., solubility parameter 14.3 (MPa)$^{1/2}$): 10 parts by weight This heat sensitive layer composition solution has a solid content of 15.5 wt %, and contains a liquid with a solubility parameter of 17.0 (MPa)$^{1/2}$ or less and a boiling point of 20 to 27° C. at a concentration of 1.56 wt %.

Initial evaluation was carried out by the same procedure as in Example 1, and 75 and circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an IP Clean HX derived liquid with a boiling point in the range of 222 to 261° C. The quantity of the IP Clean HX derived liquid generated as gas was 13.00 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Evaluation was carried out after the passage of time, and 75 and 30 circular regions were found in a 12 μm$^2$ portion of the cross section of the heat sensitive layer and in a 5 μm$^2$ upper portion of the cross section, of the heat sensitive layer, respectively. The circular regions had an average diameter of 0.20 μm. The liquid bubbles were analyzed, and it was found that they contained an IP Clean HX derived liquid with a boiling point in the range of 222 to 261° C. The quantity of the IP Clean HX derived liquid generated as gas was 13.10 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatmient development, demonstrating a high sensitivity and a high image reproducibility.

Example 9

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight
(f) Ethanol: 85 parts by weight
(g) A liquid with a solubility parameter of 17.0 (MPa)$^{1/2}$ or less and a boiling point of 210 to 270° C.: alicyclic hydrocarbon: Naphtesol (registered trademark) 220 (supplied by Nippon Oil Corporation, boiling point 221 to 240° C., solubility parameter 16.4 (MPa)$^{1/2}$): 10 parts by weight.

This heat sensitive layer composition solution has a solid content of 15.5 wt %, and contains a liquid with a solubility parameter of 17.0 (MPa)$^{1/2}$ or less and a boiling point of 210 to 270° C. at a concentration of 1.56 wt %.

Initial evaluation was carried out by the same procedure as in Example 1, and 75 and 30 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained a Naphtesol 220 derived liquid with a boiling point in the range of 221 to 240° C. The quantity of the Naphtesol 220 derived liquid generated as gas was 13.06 μg. The sensitivity was evaluated, and 1 to 99% dots were reproduced on the printing plate subjected to irradiation a an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Evaluation was carried out after the passage of time, and 75 and 30 circular regions were found in a 12 μm portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained a Naphtesol 220 derived liquid with a boiling point in the range of 221 to 240° C. The quantity of the Naphtesol 220 derived liquid generated as gas was 13.07 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Example 10

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight (f) Ethanol: 85 parts by weight (g) A liquid with a solubility parameter of 17.0 (MPa)#r or less and a boiling point of 210 to 270° C.: alkylene glycol dialkyl ether: diethylene glycol dibutyl ether (boiling point 256° C., solubility parameter 15.8 (MPa)$^{1/2}$): 10 parts by weight This heat sensitive layer composition solution has a solid content of 15.5 wt %, and contains a liquid with a solubility parameter of 17.0 (MPa)$^{1/2}$ or less and a boiling point of 210 to 270° C. at a concentration of 1.56 wt %.

Initial evaluation was carried out by the same procedure as in Example 1, and 75 and circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained diethylene glycol dibutyl ether (boiling point 256° C.). The quantity of the diethylene glycol dibutyl ether derived liquid generated as gas was 13.11 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Evaluation was carried out after the passage of time, and 75 and 30 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained diethylene glycol dibutyl ether (boiling point 256° C.). The quantity of the diethylene glycol dibutyl ether derived liquid generated as gas was 13.10 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Example 11

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight (f) Ethanol: 85 parts by weight (g) A liquid with a solubility parameter of 17.0 (MPa)$^{1/2}$ or less and a boiling point of 210 to 270° C.: alkylene glycol dialkyl ether: tripropylene glycol dimethyl ether (boiling point 215° C., solubility parameter 15.1 (MPa)$^{1/2}$): 10 parts by weight This heat sensitive layer composition solution has a solid content of 15.5 wt %, and contains a liquid with a solubility parameter of 17.0 (MPa)$^{1/2}$ or less and a boiling point of 210 to 270° C. at a concentration of 1.56 wt %.

Initial evaluation was carried out by the same procedure as in Example 1, and 75 and circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained tripropylene glycol dimethyl ether (boiling point 215° C.). The quantity of the tripropylene glycol dimethyl ether derived liquid generated as gas was 13.00 μg. The sensitivity was evaluated, and 1 to 99% dots were reproduced on the printing plate subjected to irradiation at an energy of 150 mJ/cm$^2$ and tap water development and on the printing plate subjected to irradiation at an energy of 100 mJ/cm$^2$ and pre-/post-treatment development, demonstrating a high sensitivity and a high image reproducibility.

Evaluation was carried out after the passage of time, and 75 and 30 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained tripropylene glycol dimethyl ether (boiling point 215° C.). The quantity of the tripropylene glycol dimethyl ether derived liquid generated as gas was 13.05 μg. The sensitivity was evaluated, and 1 to 99% dots were reproduced on the printing plate subjected to irradiation at an energy of 150 mJ/cm$^2$ and tap water development and an the printing plate subjected to irradiation at an energy of 100 mJ/cm$^2$ and pre-/post-treatment development, demonstrating a high sensitivity and a high image reproducibility.

Comparative Example 1

Except that the following solvent components (e) to (g) were used for the heat sensitive layer composition solution, the same procedure as in Example 1 was carried out to produce an imageable waterless planographic printing plate precursor.

(e) Methyl ethyl ketone: 439 parts by weight (f) Ethanol: 85 parts by weight (g) A liquid with a solubility parameter of 17.0 $(MPa)^{1/2}$ or less and a boiling point of 210 to 270° C.: none This heat sensitive layer composition solution has a solid content of 15.5 wt %, Initial evaluation was carried out by the same procedure as in Example 1, and no circular regions were found in the cross section of the heat sensitive layer. The sensitivity was evaluated, and 1 to 99% dots were reproduced on the printing plate subjected to irradiation at an energy of 250 $mJ/cm^2$ and tap water development and on the printing plate subjected to irradiation at an energy of 175 $mJ/cm^2$ and pre-/post-treatment development, suggesting an insufficient sensitivity.

Evaluation was carried out after the passage of time, and no circular regions were found in the cross section of the heat sensitive layer. The sensitivity was evaluated, and 1 to 99% dots were reproduced on the printing plate subjected to irradiation at an energy of 250 $mJ/cm^2$ and tap water development and on the printing plate subjected to irradiation at an energy of 175 $mJ/cm^2$ and pre-/post-treatment development, suggesting an insufficient sensitivity.

Comparative Example 2

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight (f) Ethanol: 85 parts by weight (g) Aliphatic saturated hydrocarbon: Isopar (registered trademark) H (supplied by Esso Chemical Co., Ltd., boiling point 178 to 188° C., solubility parameter 14.7 $(MPa)^{1/2}$): 10 parts by weight (h) A liquid with a solubility parameter of 17.0 $(MPa)^{1/2}$ or less and a boiling point of 210 to 270° C.: none This heat sensitive layer composition solution has a solid content of 15.5 wt %.

Initial evaluation was carried out by the same procedure as in Example 1, and 50 and circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. However, temperature programmed desorption mass spectrometry detected no liquid derived from Isopar H, suggesting that the circular bubbles found in the cross section of the heat sensitive layer were air bubbles. The sensitivity was evaluated, and 1 to 99% dots were reproduced on the printing plate subjected to irradiation at an energy of 150 $mJ/cm^2$ and tap water development and on the printing plate subjected to irradiation at an energy of 100 $mJ/cm^2$ and pre-/post-treatment development, demonstrating a high sensitivity and a high image reproducibility.

However, when evaluation was carried out after the passage of time, no circular regions were found in the cross section of the heat sensitive layer. The sensitivity was evaluated, and 1 to 99% dots were reproduced on the printing plate subjected to irradiation at an energy or 250 $mJ/cm^2$ and tap water development and on the printing plate subjected to irradiation at an energy of 175 $mJ/cm^2$ and pre-/post-treatment development, suggesting an insufficient sensitivity.

Comparative Example 3

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight (f) Ethanol: 85 parts by weight (g) Aliphatic saturated hydrocarbon: Isopar (registered trademark) L (supplied by Esso Chemical Co., Ltd., boiling point 189 to 207° C., solubility parameter 14.9 $(MPa)^{1/2}$): 10 parts by weight (h) A liquid with a solubility parameter of 17.0 $(MPa)^{1/2}$ or less and a boiling point of 210 to 270° C.: none This heat sensitive layer composition solution has a solid content of 15.5 wt %.

Initial evaluation was carried out by the same procedure as in Example 1, and 75 and circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. The liquid bubbles were analyzed, and it was found that they contained an Isopar L derived liquid with a boiling point in the range of 189 to 207° C. The quantity of the Isopar L derived liquid generated as gas was 12.98 μg. The sensitivity was evaluated, and 1 to 99% dots were reproduced on the printing plate subjected to irradiation at an energy of 150 $mJ/cm^2$ and tap water development and on the printing plate subjected to irradiation at an energy of 100 $mJ/cm^2$ and pre-/post-treatment development, demonstrating a high sensitivity and a high image reproducibility.

Evaluation was carried out after the passage of time, a d 5 and 2 circular regions were found in a 12 $\mu M^2$ portion of the cross section of the heat sensitive layer and in a 5 $\mu M^2$ upper portion of the cross section of the heat sensitive layer, respectively. The circular regions had an average diameter of 0.20 μm. The liquid bubbles were analyzed, and it was found that they contained an Isopar L derived liquid with a boiling point in the range of 189 to 207° C. The quantity of the Isopar L derived liquid generated as gas was 0.82 μg. The sensitivity was evaluated, and 1 to 99% dots were reproduced on the printing plate subjected to irradiation at an energy of 250 $mJ/cm^2$ and tap water development and on the printing plate subjected to irradiation at an energy of 175 $mJ/cm^2$ and pre-post-treatment development, suggesting an insufficient sensitivity.

Comparative Example 4

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight (f) Ethanol: 85 parts by weight (g) Aliphatic saturated hydrocarbon: Isopar (registered trademark) V (supplied by Esso Chemical Co., Ltd., boiling point 273 to 312° C., solubility parameter 14.9 $(MPa)^{1/2}$): 10 parts by weight (h) A liquid with a solubility parameter of 17.0 $(MPa)^{1/2}$ or less and a boiling point of 210 to 270° C.: none This heat sensitive layer composition solution has a solid content of 15.5 wt %.

Initial evaluation was carried out by the same procedure as in Example 1, and 75 and circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.20 μm. The liquid bubbles were analyzed, and it was found that they contained an Isopar V derived liquid with a boiling point in the range of 273 to 312° C. The quantity of the Isopar V derived liquid generated as gas was 13.13 μg. The sensitivity was evaluated, and 1 to 99% dots were reproduced on the printing plate subjected to irradiation at an energy of 175 mJ/cm$^2$ and tap water development and on the printing plate subjected to irradiation at an energy of 125 mJ/cm$^2$ and pre-/post-treatment development, suggesting an insufficient sensitivity.

Evaluation was carried out after the passage of time, and 75 and 30 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an Isopar V derived liquid with a boiling point in the range of 273 to 312° C. The quantity of the Isopar V derived liquid generated as gas was 13.10 μg. The sensitivity was evaluated, and 1 to 99% dots were reproduced on the printing plate subjected to irradiation at an energy of 175 mJ/cm$^2$ and tap water development and on the printing plate subjected to irradiation at an energy of 125 mJ/cm$^2$ and pre-/post-treatment development, suggesting an insufficient sensitivity.

Comparative Example 5

Except that the following solvent components (e) to (g) were used for the heat sensitive layer composition solution, the same procedure as in Example 1 was carried out to produce an imageable waterless planographic printing plate precursor.

(e) Methyl ethyl ketone: 429 parts by weight (f) Ethanol: 85 parts by weight (g-1) Aliphatic saturated hydrocarbon: Isopar (registered trademark) L (supplied by Esso Chemical Co., Ltd., boiling point 189 to 207° C., solubility parameter 14.9 (MPa)$^{1/2}$): 5 parts by weight (g-2) Aliphatic saturated hydrocarbon: Isopar (registered trademark) V (supplied by Esso Chemical Co., Ltd., boiling point 273 to 312° C., solubility parameter 14.9 (MPa)$^{1/2}$): 5 parts by weight (h) A liquid with a solubility parameter of 17.0 (MPa)$^{1/2}$ or less and a boiling point of 210 to 270° C.: none This heat sensitive layer composition solution has a solid content of 15.5 wt %.

Initial evaluation was carried out by the same procedure as in Example 1, and 75 and circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an Isopar L derived liquid with a boiling point in the range of 189 to 207° C. and an Isopar V derived liquid with a boiling point in the range of 273 to 312° C. The quantity of the Isopar L derived liquid generated as gas was 6.43 μg, and the quantity of the Isopar V derived liquid was 6.55 μg. The sensitivity was evaluated, and 1 to 99% dots were reproduced on the printing plate subjected to irradiation at an energy of 165 mJ/cm$^2$ and tap water development and on the printing plate subjected to irradiation at an energy of 115 mJ/cm$^2$ and pre-/post-treatment development, demonstrating a high sensitivity and a high image reproducibility.

Evaluation was carried out after the passage of time, and 35 and 15 circular regions were found in a 12 μm$^2$ portion of the cross section of the heat sensitive layer and in a 5 μm$^2$ upper portion of the cross section of the heat sensitive layer, respectively. The circular regions had an average diameter of 0.20 μm. The liquid bubbles were analyzed, and it was found that they contained an Isopar L derived liquid with a boiling point in the range of 189 to 207° C. and an Isopar V derived liquid with a boiling point in the range of 273 to 312° C. The quantity of the Isopar L derived liquid generated as gas was 0.37 μg, and the quantity of the Isopar V derived liquid was 6.50 μg. The sensitivity was evaluated, and 1 to 99% dots were reproduced on the printing plate subjected to irradiation at an energy of 200 mJ/cm$^2$ and tap water development and on the printing plate subjected to irradiation at an energy of 150 mJ/cm$^2$ and pre-/post-treatment development, suggesting an insufficient sensitivity.

Example 12

Except that the following solvent component (e) was used for the heat sensitive layer composition solution, the same procedure as in Example 2 was carried out to produce an imageable waterless planographic printing plate precursor.

(e) Acetone (boiling point 56° C., solubility parameter 20.3 (MPa)$^{1/2}$): 429 parts by weight This heat sensitive layer composition solution has a solid content of 15.5 wt %, and contains a liquid with a solubility parameter of 17.0 (MPa)$^{1/2}$ or less and a boiling point of 210 to 270° C. at a concentration of 1.56 wt %.

Initial evaluation was carried out by the same procedure as in Example 1, and 600 and 250 circular regions were found in a 12 μm$^2$ portion of the cross section of the heat sensitive layer and in a 5 μm$^2$ upper portion of the cross section of the heat sensitive layer, respectively. The circular regions had an average diameter of 0.10 μm. The liquid bubbles were analyzed, and it was found that they contained an Isopar M derived liquid with a boiling point in the range of 223 to 254° C. The quantity of the Isopar M derived liquid generated as gas was 13.51 μg. The sensitivity was evaluated, and 1 to 99% dots were reproduced on the printing plate subjected to irradiation at an energy of 120 mJ/cm$^2$ and tap water development and on the printing plate subjected to irradiation at an energy of 70 mJ/cm$^2$ and pre-/post-treatment development, demonstrating a high sensitivity and a high image reproducibility.

Evaluation was carried out after the passage of time, and 600 and 250 circular regions were found in a 12 μm$^2$ portion of the cross section of the heat sensitive layer and in a 5 μm$^2$ upper portion of the cross section of the heat sensitive layer, respectively. The circular regions had an average diameter of 0.10 μm. The liquid bubbles were analyzed, and it was found that they contained an Isopar M derived liquid with a boiling point in the range of 223 to 254° C. The quantity of the Isopar M derived liquid generated as gas was 13.49 μg. The sensitivity was evaluated, and 1 to 99% dots were reproduced on the printing plate subjected to irradiation at an energy of 120 mJ/cm$^2$ and tap water development and on the printing plate subjected to irradiation at an energy of 70 mJ/cm$^2$ and pre-/post-treatment development, demonstrating a high sensitivity and a high image reproducibility.

Example 13

Except that the following solvent component (e) was used for the heat sensitive layer composition solution, the same procedure as in Example 2 was carried out to produce an imageable waterless planographic printing plate precursor.

(e) Tetrahydrofuran (boiling point 66° C., solubility parameter 18.6 (MPa)$^{1/2}$): 429 parts by weight This heat sensitive layer composition solution has a solid content of 15.5 wt %, and contains a liquid with a solubility parameter of 17.0 $(MPa)^{1/2}$ or less and a boiling point of 210 to 270° C. at a concentration of 1.56 wt %.

Initial evaluation was carried out by the same procedure as in Example 1, and 240 and 100 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.15 μm. The liquid bubbles were analyzed, and it was found that they contained an Isopar M derived liquid with a boiling point in the range of 223 to 254° C. The quantity of the Isopar M derived liquid generated as gas was 13.35 μg. The sensitivity was evaluated, and 1 to 99% dots were reproduced on the printing plate subjected to irradiation at an energy of 130 $mJ/cm^2$ and tap water development and on the printing plate subjected to irradiation at an energy of 80 $mJ/cm^2$ and pre-/post-treatment development, demonstrating a high sensitivity and a high image reproducibility.

Evaluation was carried out after the passage of time, and 240 and 100 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.15 μm. The liquid bubbles were analyzed, and it was found that they contained an Isopar M derived liquid with a boiling point in the range of 223 to 254° C. The quantity of the Isopar M derived liquid generated as gas was 13.38 μg. The sensitivity was evaluated, and 1 to 99% dots were reproduced on the printing plate subjected to irradiation at an energy of 130 $mJ/cm^2$ and tap water development and on the printing plate subjected to irradiation at an energy of 80 $mJ/cm^2$ and pre-/post-treatment development, demonstrating a high sensitivity and a high image reproducibility.

Example 14

Except that the following solvent component (e) was used for the heat sensitive layer composition solution, the same procedure as in Example 2 was carried out to produce an imageable waterless planographic printing plate precursor.

(e) Methyl isobutyl ketone (boiling point 116° C., solubility parameter 17.2 $(MPa)^{1/2}$): 429 parts by weight This heat sensitive layer composition solution has a solid content of 15.5 wt %, and contains a liquid with a solubility parameter of 17.0 $(MPa)^{1/2}$ or less and a boiling point of 210 to 270° C. at a concentration of 1.56 wt %.

Initial evaluation was carried out by the same procedure as in Example 1, and 25 and circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.30 μm. The liquid bubbles were analyzed, and it was found that they contained an Isopar M derived liquid with a boiling point in the range of 223 to 254° C. The quantity of the Isopar M derived liquid generated as gas was 13.01 μg. The sensitivity was evaluated, and 1 to 99% dots were reproduced on the printing plate subjected to irradiation at an energy of 160 $mJ/cm^2$ and tap water development and on the printing plate subjected to irradiation at an energy of 110 $mJ/cm^2$ and pre-/post-treatment development, demonstrating a high sensitivity and a high image reproducibility.

Evaluation was carried out after the passage of time, and 25 and 10 circular regions were found in a 12 $\mu m^2$ portion of the cross section of the heat sensitive layer and in a 5 $\mu m^2$ upper portion of the cross section of the heat sensitive layer, respectively. The circular regions had an average diameter of 0.30 μm. The liquid bubbles were analyzed, and it was found that they contained an Isopar M derived liquid with a boiling point in the range of 223 to 254° C. The quantity of the Isopar M derived liquid generated as gas was 12.97 μm. The sensitivity was evaluated, and 1 to 99% dots were reproduced on the printing plate subjected to irradiation at an energy of 160 $mJ/cm^2$ and tap water development and on the printing plate subjected to irradiation at an energy of 110 $mJ/cm^2$ and pre-/post-treatment development, demonstrating a high sensitivity and a high image reproducibility.

For Examples 1 to 14 and Comparative examples 1 to 5, the liquids with a solubility parameter of 17.0 $(MPa)^{1/2}$ or less and the solvents with a solubility parameter of more than 17.0 $(MPa)^{1/2}$ are listed in Table 1, and evaluation results are given in Table 2. In Table 1, MEK, THF and MIBK denote methyl ethyl ketone, tetrahydrofuran, and methyl isobutyl ketone, respectively.

TABLE 1

| | Solvent with solubility parameter of 17.0 $(MPa)^{1/2}$ or less | | Content in heat sensitive layer composition solution (parts by weight) | | Solvent with solubility parameter of more than 17.0 $(MPa)^{1/2}$ | | Content (wt %) | | |
|---|---|---|---|---|---|---|---|---|---|
| | Material | Boiling point (° C.) | Total | Components with boiling point 210-270° C. | Main solvent | Boiling point (° C.) | Boiling point 200° C. or less | Boiling point 80° C. or less | Boiling point 70° C. or less |
| Example 1 | Isopar M | 223-254 | 5 | 5 | MEK | 80 | 100 | 98 | 0 |
| Example 2 | Isopar M | 223-254 | 10 | 10 | MEK | 80 | 100 | 98 | 0 |
| Example 3 | Isopar M | 223-254 | 20 | 20 | MEK | 80 | 100 | 98 | 0 |
| Example 4 | Isopar M | 223-254 | 30 | 30 | MEK | 80 | 100 | 98 | 0 |
| Example 5 | Isopar M | 223-254 | 40 | 40 | MEK | 80 | 100 | 98 | 0 |
| Example 6 | Isopar M | 223-254 | 50 | 50 | MEK | 80 | 100 | 98 | 0 |
| Example 7 | IP solvent 2028 | 213-262 | 10 | 10 | MEK | 80 | 100 | 98 | 0 |
| Example 8 | IP Clean HX | 222-261 | 10 | 10 | MEK | 80 | 100 | 98 | 0 |
| Example 9 | Naphtesol 220 | 221-240 | 10 | 10 | MEK | 80 | 100 | 98 | 0 |
| Example 10 | diethylene glycol dibutyl ether | 256 | 10 | 10 | MEK | 80 | 100 | 98 | 0 |
| Example 11 | tripropylene glycol dimethyl ether | 215 | 10 | 10 | MEK | 80 | 100 | 98 | 0 |

TABLE 1-continued

| | Solvent with solubility parameter of 17.0 $(MPa)^{1/2}$ or less | | Content in heat sensitive layer composition solution (parts by weight) | | Solvent with solubility parameter of more than 17.0 $(MPa)^{1/2}$ | | Content (wt %) | | |
|---|---|---|---|---|---|---|---|---|---|
| | Material | Boiling point (° C.) | Total | Components with boiling point 210-270° C. | Main solvent | Boiling point (° C.) | Boiling point 200° C. or less | Boiling point 80° C. or less | Boiling point 70° C. or less |
| Example 12 | Isopar M | 223-254 | 10 | 10 | acetone | 56 | 100 | 98 | 81 |
| Example 13 | Isopar M | 223-254 | 10 | 10 | THF | 66 | 100 | 98 | 81 |
| Example 14 | Isopar M | 223-254 | 10 | 10 | MIBK | 116 | 100 | 17 | 0 |
| Comparative example 1 | None | — | 0 | 0 | MEK | 80 | 100 | 98 | 0 |
| Comparative example 2 | Isopar H | 178-188 | 10 | 0 | MEK | 80 | 100 | 98 | 0 |
| Comparative example 3 | Isopar L | 189-207 | 10 | 0 | MEK | 80 | 100 | 98 | 0 |
| Comparative example 4 | Isopar V | 273-312 | 10 | 0 | MEK | 80 | 100 | 98 | 0 |
| Comparative example 5 | Isopar L/Isopar V | 189-207/ 273-312 | 5/5 | 0 | MEK | 80 | 100 | 98 | 0 |

TABLE 2

| | Initial evaluation | | | | Evaluation after the passage of time | | | |
|---|---|---|---|---|---|---|---|---|
| | Average diameter of liquid bubbles (μm) | Number of liquid bubbles (pieces/5 $\mu m^{2)}$ | Sensitivity ($ml/cm^2$) Tap water development | Sensitivity ($ml/cm^2$) Pre/Post-treatment liquid development | Average diameter of liquid bubbles (μm) | Number of liquid bubbles (pieces/5 $\mu m^{2)}$ | Sensitivity ($ml/cm^2$) Tap water development | Sensitivity ($ml/cm^2$) Pre/Post-treatment liquid development |
| Example 1 | 0.20 | 15 | 150 | 100 | 0.20 | 15 | 150 | 100 |
| Example 2 | 0.20 | 30 | 150 | 100 | 0.20 | 30 | 150 | 100 |
| Example 3 | 0.20 | 60 | 150 | 100 | 0.20 | 60 | 150 | 100 |
| Example 4 | 0.20 | 75 | 150 | 100 | 0.20 | 75 | 150 | 100 |
| Example 5 | 0.20 | 80 | 150 | 100 | 0.20 | 80 | 150 | 100 |
| Example 6 | 0.20 | 80 | 150 | 100 | 0.20 | 80 | 150 | 100 |
| Example 7 | 0.20 | 30 | 150 | 100 | 0.20 | 30 | 150 | 100 |
| Example 8 | 0.20 | 30 | 150 | 100 | 0.20 | 30 | 150 | 100 |
| Example 9 | 0.20 | 30 | 150 | 100 | 0.20 | 30 | 150 | 100 |
| Example 10 | 0.20 | 30 | 150 | 100 | 0.20 | 30 | 150 | 100 |
| Example 11 | 0.20 | 30 | 150 | 100 | 0.20 | 30 | 150 | 100 |
| Example 12 | 0.10 | 250 | 120 | 70 | 0.10 | 250 | 120 | 70 |
| Example 13 | 0.15 | 100 | 130 | 80 | 0.15 | 100 | 130 | 80 |
| Example 14 | 0.30 | 10 | 160 | 110 | 0.30 | 10 | 160 | 110 |
| Comparative example 1 | NA | 0 | 250 | 175 | None | 0 | 250 | 175 |
| Comparative example 2 | 0.20* | 20* | 150 | 100 | None | 0 | 250 | 175 |
| Comparative example 3 | 0.2 | 30 | 150 | 100 | 0.2 | 2 | 250 | 175 |
| Comparative example 4 | 0.2 | 30 | 175 | 125 | 0.2 | 30 | 175 | 125 |
| Comparative example 5 | 0.2 | 30 | 165 | 115 | 0.2 | 15 | 200 | 150 |

*air bubbles

Industrial Applicability

The directly imageable waterless planographic printing plate can be used in general printing industries (commercial printing, newspaper printing, and printing of nonabsorbable materials such as film, resin plates, or metal). It is also applied to display industries for production of PDPs and LCDs, and printable electronics industries where printing processes are used to produce wiring patterns.

The invention claimed is:

1. A directly imageable waterless planographic printing plate precursor comprising at least a heat sensitive layer and a silicone rubber layer formed on a substrate in this order, wherein said heat sensitive layer contains liquid bubbles incorporating a liquid with a boiling point in the range of 210 to 270° C.

2. The printing plate precursor as claimed in claim 1, wherein said liquid has a solubility parameter of 17.0 $(MPa)^{1/2}$ or less.

3. The printing plate precursor as claimed in claim 1, wherein said liquid bubbles have an average diameter of 0.25 μm or less.

4. The printing plate precursor as claimed in claim 2, wherein said liquid bubbles have an average diameter of 0.25 μm or less.

5. A method of producing a waterless planographic printing plate comprising:

a step of exposing a directly imageable waterless planographic printing plate precursor as claimed in claim 1 to laser beam according to an image pattern; and a step of applying friction to the exposed directly imageable waterless planographic printing plate precursor in the presence of water or a liquid consisting of water and a surface active agent to remove the silicone rubber layer from the exposed area.

6. A method of producing a waterless planographic printing plate comprising:

a step of exposing a directly imageable waterless planographic printing plate precursor as claimed in claim 2 to laser beam according to an image pattern; and a step of applying friction to the exposed directly imageable waterless planographic printing plate precursor in the presence of water or a liquid consisting of water and a surface active agent to remove the silicone rubber layer from the exposed area.

7. A method of producing a waterless planographic printing plate comprising:

a step of exposing a directly imageable waterless planographic printing plate precursor as claimed in claim 3 to laser beam according to an image pattern; and a step of applying friction to the exposed directly imageable waterless planographic printing plate precursor in the presence of water or a liquid consisting of water and a surface active agent to remove the silicone rubber layer from the exposed area.

8. A method of producing a directly imageable waterless planographic printing plate precursor comprising at least a heat sensitive layer and a silicone rubber layer formed on a substrate in this order, said method comprising:

at least a step of applying a solution of a heat sensitive layer composition containing a solvent with a solubility parameter of 17.0 $(MPa)^{1/2}$ or less and a boiling point of 210 to 270° C. and a solvent with a solubility parameter of more than 17.0 $(MPa)^{1/2}$ over a substrate or a substrate coated with a resin layer;

a step of drying said solution of a heat sensitive layer composition to form a heat sensitive layer; and a step of applying a silicone rubber layer composition over said heat sensitive layer to form a silicone rubber layer.

9. The method as claimed in claim 8 wherein solvent components with a boiling point of 80° C. or less account for 80 weight percent or more of said solvent with a solubility parameter of more than 17.0 $(MPa)^{1/2}$.

10. A method of producing a directly imageable waterless planographic printing plate precursor comprising at least a heat sensitive layer and a silicone rubber layer formed on a substrate in this order, said method comprising:

at least a step of applying a solution of a heat sensitive layer composition containing a solvent with a solubility parameter of 17.0 $(MPa)^{1/2}$ or less and a boiling point of 210 to 270° C. and a solvent with a solubility parameter of more than 17.0 $(MPa)^{1/2}$ over a substrate or a substrate coated with a resin layer;

a step of drying said solution of a heat sensitive layer composition to form a heat sensitive layer;

a step of applying a solution of a silicone rubber layer composition over said heat sensitive layer; and a step of drying said solution of a silicone rubber layer composition to form a silicone rubber layer.

11. The method as claimed in claim 10, wherein solvent components with a boiling point of 80° C. or less account for 80 weight percent or more of said solvent with a solubility parameter of more than 17.0 $(MPa)^{1/2}$.

* * * * *

UNITED STATES PATENT AND TRADEMARK OFFICE

CERTIFICATE OF CORRECTION

PATENT NO. : 8,298,749 B2
APPLICATION NO. : 13/202417
DATED : October 30, 2012
INVENTOR(S) : Iihara et al.

It is certified that error appears in the above-identified patent and that said Letters Patent is hereby corrected as shown below:

In the Specifications:

<u>In Column 2</u>

At line 10, please change “33192” to -- 331924 --.

<u>In Column 5</u>

At line 9, please change “1.6.2” to -- 16.2 --.

<u>In Column 7</u>

At line 26, after “Ti(IV),” please insert -- Mn(II), Mn (III), --; and
at line 55, after “Cu(I),” please insert -- Cu(II), Zn (II) --.

<u>In Column 35</u>

At line 38, please replace “(MPa)#r” with -- $(MPa)^{1/2}$ --.

<u>In Column 38</u>

At line 30, please replace “12 $\mu M^2$” with -- 12 $\mu m^2$ --; and
at line 31, please replace “5 $\mu M^2$” with -- 5 $\mu m^2$ --.

Signed and Sealed this
Twenty-third Day of April, 2013

Teresa Stanek Rea
*Acting Director of the United States Patent and Trademark Office*